(12) United States Patent
Yoneda et al.

(10) Patent No.: US 8,011,256 B2
(45) Date of Patent: Sep. 6, 2011

(54) MAGNETOSTRICTIVE TORQUE SENSOR AND METHOD OF MANUFACTURING SAME

(75) Inventors: Atsuhiko Yoneda, Utsunomiya (JP); Yasuo Shimizu, Shimotsuke (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 12/756,283

(22) Filed: Apr. 8, 2010

(65) Prior Publication Data

US 2010/0263457 A1 Oct. 21, 2010

(30) Foreign Application Priority Data

Apr. 17, 2009 (JP) .................................. 2009-101041

(51) Int. Cl.
*G01R 3/00* (2006.01)
*G01L 3/00* (2006.01)

(52) U.S. Cl. ................. 73/862.335; 73/862.333; 29/595

(58) Field of Classification Search ............ 73/862.331–862.336; 29/595
See application file for complete search history.

(56) References Cited

U.S. PATENT DOCUMENTS

| | | | | |
|---|---|---|---|---|
| 4,823,617 A * | 4/1989 | Hase et al. | | 73/862.335 |
| 5,442,966 A * | 8/1995 | Hase et al. | | 73/862.335 |
| 5,526,328 A * | 6/1996 | Oshima et al. | | 369/13.02 |
| 6,422,095 B1 * | 7/2002 | Shimizu et al. | | 73/862.335 |
| 6,595,074 B2 * | 7/2003 | Shimizu et al. | | 73/862.333 |
| 6,868,936 B2 * | 3/2005 | Shimizu et al. | | 180/444 |
| 6,884,519 B2 * | 4/2005 | Shimizu et al. | | 428/831 |
| 6,966,232 B2 * | 11/2005 | Asaumi et al. | | 73/862.333 |
| 6,978,686 B2 * | 12/2005 | Shimizu et al. | | 73/862.335 |
| 7,310,870 B2 * | 12/2007 | Shimizu et al. | | 29/594 |
| 7,377,194 B2 * | 5/2008 | Shimizu et al. | | 74/409 |
| 7,386,930 B2 * | 6/2008 | Shimizu et al. | | 29/594 |
| 7,428,130 B2 * | 9/2008 | Jogo et al. | | 360/324.12 |
| 7,478,568 B2 * | 1/2009 | Yoneda et al. | | 73/862.333 |
| 7,506,554 B2 * | 3/2009 | Shimizu et al. | | 73/862.331 |
| 7,568,274 B2 * | 8/2009 | Yoneda et al. | | 29/458 |
| 7,581,455 B2 * | 9/2009 | Shimizu | | 73/862.333 |
| 7,584,673 B2 * | 9/2009 | Shimizu | | 73/862.333 |
| 7,621,368 B2 * | 11/2009 | Shimizu et al. | | 180/444 |
| 7,624,653 B2 * | 12/2009 | Watanabe et al. | | 73/862.331 |
| 7,640,815 B2 * | 1/2010 | Yoneda et al. | | 73/862.333 |
| 7,730,602 B2 * | 6/2010 | Shimizu et al. | | 29/595 |
| 7,735,382 B2 * | 6/2010 | Shimizu | | 73/862.333 |
| 7,752,921 B2 * | 7/2010 | Yoneda et al. | | 73/862.333 |
| 7,752,922 B2 * | 7/2010 | Shimizu | | 73/862.333 |
| 7,752,923 B2 * | 7/2010 | Shimizu | | 73/862.333 |
| 7,762,148 B2 * | 7/2010 | Shimizu et al. | | 73/862.331 |
| 2007/0283767 A1 * | 12/2007 | Watanabe et al. | | 73/862.331 |

FOREIGN PATENT DOCUMENTS

| | | |
|---|---|---|
| JP | 2002-257648 A | 9/2002 |
| JP | 2004-340744 | 12/2004 |
| JP | 2007-024641 A | 2/2007 |
| JP | 2007-114062 A | 5/2007 |
| JP | 2008-267865 A | 11/2008 |

* cited by examiner

*Primary Examiner* — Lisa Caputo
*Assistant Examiner* — Jonathan Dunlap
(74) *Attorney, Agent, or Firm* — Carrier Blackman & Associates, P.C.; Joseph P. Carrier; William D. Blackman

(57) ABSTRACT

A magnetostrictive torque sensor includes a single magnetostrictive film disposed on a steering shaft, and first and second coils for detecting changes in a magnetic property of the magnetostrictive film. The single magnetostrictive film includes a first anisotropic region and a second anisotropic region, having respective magnetic anisotropies inverse to each other. The first coil is disposed in confronting relation to the first anisotropic region, whereas the second coil is disposed in confronting relation to the second anisotropic region.

9 Claims, 19 Drawing Sheets

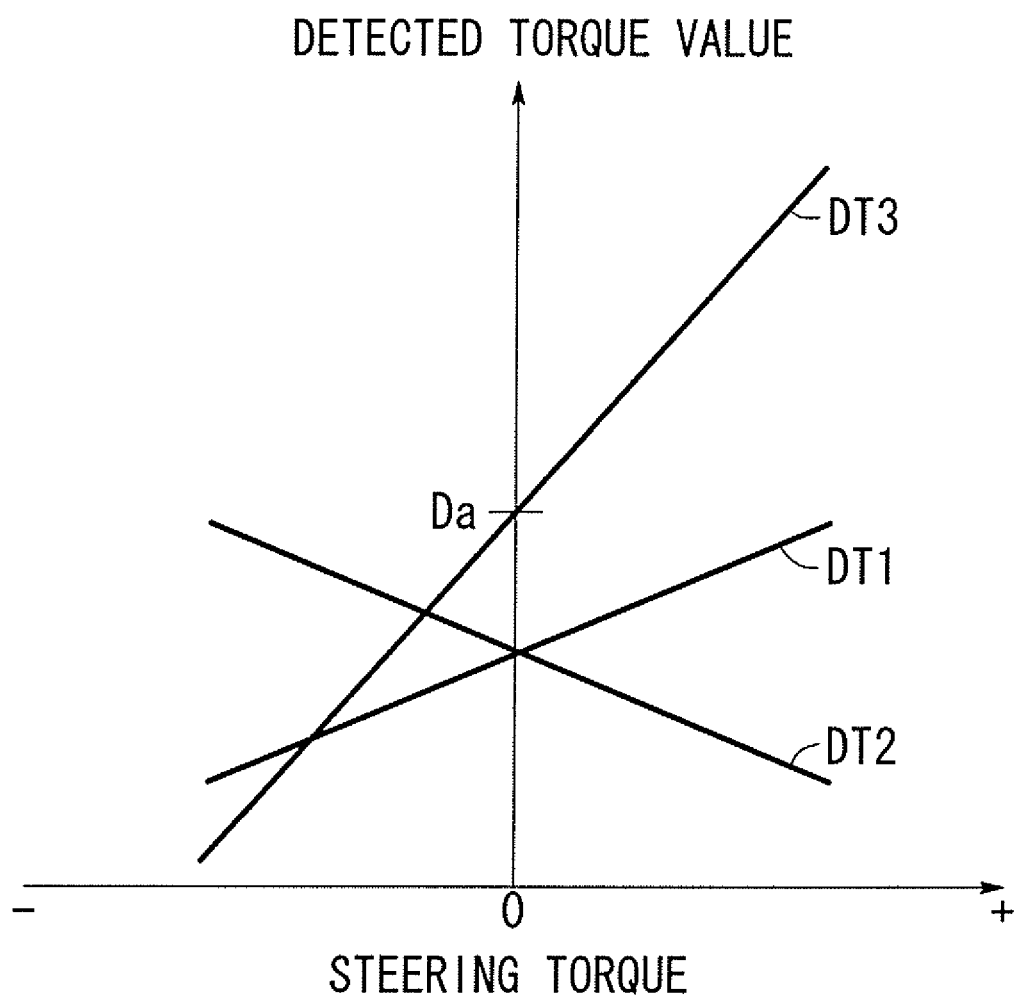

MAGNETOSTRICTIVE TORQUE SENSOR AND METHOD OF MANUFACTURING SAME

CROSS-REFERENCE TO RELATED APPLICATION

This application is based upon and claims the benefit of priority from Japanese Patent Application No. 2009-101041 filed on Apr. 17, 2009, of which the contents are incorporated herein by reference.

BACKGROUND OF THE INVENTION

1. Field of the Invention

The present invention relates to a magnetostrictive torque sensor for detecting torque based on a change in a magnetic property due to magnetostriction, as well as to a method of manufacturing such a magnetostrictive torque sensor.

2. Description of the Related Art

Generally, an electric power steering apparatus on a vehicle includes a motor incorporated in a steering system, and a controller for controlling the power supplied from the motor in order to reduce a steering torque that is applied to the steering shaft by the driver of the vehicle.

As shown in FIG. 11 of the accompanying drawings, an electric power steering apparatus 200 of the related art includes a steering torque detector (torque sensor) 208 disposed in a steering gearbox 202 for detecting a steering torque, which acts on a steering shaft 206 coupled to a steering wheel 204. The torque sensor 208 outputs a detected torque value, which is supplied to a controller 236 as a reference signal, for thereby enabling a motor to generate an appropriate assistive steering torque.

More specifically, when the driver turns the steering wheel 204, the steering wheel 204 produces a steering torque and a steering angle, which are applied through the steering shaft 206 and other members to a steering shaft 210 of the steering gearbox 202.

The steering gearbox 202 comprises the steering shaft 210, the torque sensor 208, a motor 212 for generating an assistive steering torque to assist the driver in turning the steering wheel 204, a speed reducer 214 including a worm 216 and a worm wheel 218 for increasing the assistive steering torque generated by the motor 212, a rack and pinion gear mechanism 220 including a rack shaft 228 and a rack gear 222, and a screw groove 226 of a ball screw 224.

The steering wheel 204 is coupled to an end of the steering shaft 210 through the steering shaft 206 and other members. The opposite end of the steering shaft 210 forms a pinion gear 230 of the rack and pinion gear mechanism 220.

The assistive steering torque, which is increased by the speed reducer 214, is converted by the ball screw 224 into a thrust force in axial directions of the rack shaft 228. The thrust force is transmitted through tie rods 232a, 232b to left and right tires 234a, 234b of the vehicle. Depending on the steering angle of the steering wheel 204, the tires 234a, 234b turn about vertical axes thereof in order to change the direction of travel of the vehicle.

The controller 236 (ECU) controls the motor 212 based on at least the signal from the torque sensor 208, and a signal from a vehicle speed sensor 238.

The steering torque applied from the steering wheel 204 when the steering wheel 204 is turned by the driver is detected by the torque sensor 208. The controller 236 controls the motor 212 based on the torque signal from the torque sensor 208 and the signal from the vehicle speed sensor 238. The rotational torque generated by the motor 212 acts through the speed reducer 214, the ball screw 224, and the rack shaft 228 on the pinion gear 230 of the rack and pinion gear mechanism 220, thereby reducing the torque required for the driver to turn the steering wheel 204. In this manner, the burden imposed on the driver when turning the steering wheel 204, i.e., the burden imposed on the driver to produce the steering torque, is reduced.

The torque sensor 208 may be a torsion-bar torque sensor for detecting torque based on twisting of a torsion bar disposed between pinion input and output shafts, or a magnetostrictive torque sensor. In this case, it is assumed that the torque sensor 208 comprises a magnetostrictive torque sensor. A steering torque and a steering angle generated when the driver turns the steering wheel 204 are applied through couplings 240 (e.g., serrations) to the steering shaft 210 of the steering gearbox 202. As shown in FIG. 12 of the accompanying drawings, the steering shaft 210 is rotatably supported in the steering gearbox 202 by a first bearing 242a positioned near one end of the steering shaft 210, a second bearing 242b positioned centrally along the steering shaft 210, and a third bearing 242c positioned near the other end of the steering shaft 210.

Heretofore, the magnetostrictive torque sensor 208 has been made of two magnetostrictive films, i.e., a first magnetostrictive film 244a and a second magnetostrictive film 244b, which are grown on the surface of the steering shaft 210 by means of Ni—Fe plating, for example, such that the first magnetostrictive film 244a and the second magnetostrictive film 244b are disposed on respective upper and lower positions on the steering shaft 210, and have respective axial widths with mutually opposite magnetic anisotropic properties. When a steering torque is applied from the steering shaft 210 to the first magnetostrictive film 244a and the second magnetostrictive film 244b, inverse magnetostrictive properties exhibited by the first magnetostrictive film 244a and the second magnetostrictive film 244b based on the respective magnetic anisotropic properties thereof are detected based on AC resistances, etc., of a first coil 246a and a second coil 246b, which are disposed respectively around the first magnetostrictive film 244a and the second magnetostrictive film 244b, thereby detecting the steering torque. Such a magnetostrictive torque sensor 208 is disclosed in Japanese Laid-Open Patent Publication No. 2002-257648, and Japanese Laid-Open Patent Publication No. 2004-340744, for example.

Specific details of the magnetostrictive torque sensor 208 will be described below with reference to FIGS. 12 through 19 of the accompanying drawings.

The first magnetostrictive film 244a and the second magnetostrictive film 244b are formed on the steering shaft 210 by plating an Ni—Fe alloy to a thickness of about 40 µm on the steering shaft 210, which is selectively masked (see FIG. 15).

FIG. 12 shows the layout of the first coil 246a and the second coil 246b, as well as the first magnetostrictive film 244a and the second magnetostrictive film 244b of the magnetostrictive torque sensor 208. As shown in FIG. 12, the first magnetostrictive film 244a and the second magnetostrictive film 244b on the surface of the steering shaft 210 are spaced from each other by a gap 248 formed therebetween. The first coil 246a and the second coil 246b are disposed respectively around the first magnetostrictive film 244a and the second magnetostrictive film 244b, with a small gap of about 0.5 mm interposed therebetween. The first coil 246a and the second coil 246b are electrically connected to respective detecting circuits. A first back yoke 250a and a second back yoke 250b, which serve as magnetic shields, are disposed respectively over the first coil 246a and the second coil 246b. A spacer 252 is interposed between the first back yoke 250a and the second back yoke 250b.

When a torque is applied to the steering shaft 210, the torque also is applied to the first magnetostrictive film 244a and to the second magnetostrictive film 244b, which develop an inverse magnetostrictive effect depending on the applied torque. Due to such an inverse magnetostrictive effect, the magnetic permeabilities of the first magnetostrictive film 244a and the second magnetostrictive film 244b change, resulting in changes in inductances of the first coil 246a and the second coil 246b. While the detecting circuits supply high-frequency AC voltages (exciting voltages) to the first coil 246a and the second coil 246b, changes in inductance of the first coil 246a and the second coil 246b are detected as voltage changes, which represent the applied steering torque.

An example of such inverse magnetostrictive properties is shown in FIG. 13. In FIG. 13, the horizontal axis represents the steering torque, whereas the vertical axis represents impedances of the first coil 246a and the second coil 246b, which are developed therein when AC voltages are applied to the first coil 246a and the second coil 246b. In FIG. 13, the characteristic curve C10 represents how the impedance of the first coil 246a changes, whereas the characteristic curve C11 represents how the impedance of the second coil 246b changes.

When the steering torque changes from a negative value to a positive value, the impedance of the first coil 246a increases. When the steering torque reaches a positive value T1, the impedance of the first coil 246a reaches a peak level P1, and when the steering torque has a value greater than the positive value T1, the impedance of the first coil 246a decreases. When the steering torque changes from a positive value to a negative value, the impedance of the second coil 246b or the voltage induced across the second coil 246b increases. When the steering torque reaches a negative value −T1, the impedance of the second coil 246b reaches a peak level P1, and when the steering torque increases beyond the negative value −T1, the impedance of the first coil 246a decreases. The steering torque vs. impedance characteristic curve C10 provided by the first coil 246a, as well as the steering torque vs. impedance characteristic curve C11 provided by the second coil 246b, essentially are convex upwardly oriented, as shown in FIG. 13. The steering torque vs. impedance characteristic curve C10, as well as the steering torque vs. impedance characteristic curve C11, substantially are symmetric with respect to the vertical axis due to the inverse magnetostrictive properties exhibited by the first magnetostrictive film 244a and the second magnetostrictive film 244b. FIG. 13 also shows a characteristic curve C12 representing how the impedances of the first coil 246a and the second coil 246b change when the first magnetostrictive film 244a and the second magnetostrictive film 244b are not anisotropic.

A process of rendering the first magnetostrictive film 244a and the second magnetostrictive film 244b anisotropic in order to provide the characteristic curves C10, C11 will be described below.

First, as shown in FIG. 14A, while a torque of 10 kgm is applied in one direction to the steering shaft 210, the upper first magnetostrictive film 244a is high-frequency heated to 300° C. by a heating coil 254. Thereafter, the first magnetostrictive film 244a is cooled, and then the torque is removed in order to render the first magnetostrictive film 244a anisotropic.

Then, as shown in FIG. 14B, while a torque of 10 kgm is applied in an opposite direction to the steering shaft 210, the lower second magnetostrictive film 244b is high-frequency heated to 300° C. by the heating coil 254. Thereafter, the second magnetostrictive film 244b is cooled, and then the torque is removed in order to render the second magnetostrictive film 244b anisotropic.

In FIG. 13, the straight line L10 represents values produced by subtracting the characteristic curve C11 detected by the second coil 246b from the characteristic curve C10 detected by the first coil 246a. When the steering torque is zero, the value of the straight line L10 also is zero. The straight line L10 indicates that impedance changes occur essentially rectilinearly within a torque range W in which the magnetostrictive torque sensor 208 normally is used. The magnetostrictive torque sensor 208 is used within a range in which the characteristic curves C10, C11 have a substantially constant gradient near the torque midpoint, and hence the magnetostrictive torque sensor 208 outputs a detected signal commensurate with the direction and magnitude of the applied steering torque. Based on the straight line L10, the steering torque can be detected from the impedances of the first coil 246a and the second coil 246b.

In FIG. 13, the straight line L20 represents values produced by adding the characteristic curve C11 detected by the second coil 246b and the characteristic curve C10 detected by the first coil 246a, and then adding a certain value to the sum thereof. The values represented by the straight line L20 are constant irrespective of the steering torque. It is possible to detect failures of the detecting circuits and the first coil 246a and the second coil 246b by monitoring whether a signal generated by the magnetostrictive torque sensor 208 and represented by the straight line L20 falls within a given range or not.

With the magnetostrictive torque sensor 208, two magnetostrictive films, i.e., the first magnetostrictive film 244a and the second magnetostrictive film 244b, are disposed in respective upper and lower positions, with the gap 248 being interposed therebetween. Therefore, the magnetostrictive torque sensor 208 tends to suffer from output characteristic variations if the first magnetostrictive film 244a and the second magnetostrictive film 244b are not properly positioned or have improper lengths, or if the first coil 246a and the second coil 246b are not properly positioned.

To avoid the above problems, it has heretofore been customary to fabricate the first magnetostrictive film 244a and the second magnetostrictive film 244b so as to have a larger axial dimension than the first coil 246a and the second coil 246b, and to position the first coil 246a and the second coil 246b in alignment with respective central regions of the first magnetostrictive film 244a and the second magnetostrictive film 244b. However, since the axial dimensions of the first magnetostrictive film 244a and the second magnetostrictive film 244b must be increased, the magnetostrictive torque sensor 208, as well as the electric power steering apparatus 200 incorporating the magnetostrictive torque sensor 208 therein, inevitably become larger in size.

More specifically, the first magnetostrictive film 244a and the second magnetostrictive film 244b include regions having magnetic permeability irregularities in upper and lower end portions thereof. For example, in order to deposit the first magnetostrictive film 244a and the second magnetostrictive film 244b on the steering shaft 210 by means of Ni—Fe plating, the steering shaft 210 is masked, as shown in FIG. 15, before the steering shaft 210 is dipped into a plating solution for carrying out electrolytic plating thereon. At this time, the steering shaft 210 is selectively masked by a first mask 256a, which covers an end portion of the steering shaft 210, a second mask 256b, which covers a portion of the steering shaft 210 extending from an opposite end toward an axially central region thereof, and a third mask 256c, which covers a portion of the steering shaft 210 corresponding to the gap 248 between the first magnetostrictive film 244a and the second magnetostrictive film 244b. When the steering shaft 210 is electrolytically plated, electric lines of force are concentrated on the boundaries of the first mask 256a, the second mask 256b, and the third mask 256c on the steering shaft 210. Therefore, as shown in FIG. 16A, the electric current density, which flows in the plating process, is higher at axial upper and lower ends of the exposed regions of the steering shaft 210 where the first magnetostrictive film 244a and the second magnetostrictive film 244b are formed. As a result, as shown in FIG. 16B, the thickness of the first magnetostrictive film 244a and the second magnetostrictive film 244b at upper and lower ends thereof becomes greater than in other regions of the first magnetostrictive film 244a and the second magnetostrictive film 244b, and as a result, the first magnetostrictive film 244a and the second magnetostrictive film 244b have thickness irregularities. As shown in FIG. 17, if the first coil 246a and the second coil 246b are positioned facing the regions having thickness irregularities, then the output characteristics of the magnetostrictive torque sensor 208, i.e., a detected signal VT1 from the first coil 246a and a detected signal VT2 from the second coil 246b, are unduly changed. For example, when the steering torque is zero, the voltages (midpoint voltages) and gains of the first coil 246a and the second coil 246b, which are associated respectively with the first magnetostrictive film 244a and the second magnetostrictive film 244b, are different from each other, or the voltages (midpoint voltages) and gains of the first coil 246a and the second coil 246b, at a time when the first coil 246a and the second coil 246b face regions having thickness irregularities therein, are different from the voltages (midpoint voltages) and gains of the first coil 246a and the second coil 246b at a time when the first coil 246a and the second coil 246b do not face regions having thickness irregularities therein.

The first coil 246a and the second coil 246b tend to face the thickness irregularities when the coil housing 258 including the first coil 246a and the second coil 246b and the steering shaft 210 are secured to the steering gearbox 202, as shown in FIG. 11. At this time, the fixed positions of the first coil 246a and the second coil 246b, and the fixed positions of the first magnetostrictive film 244a and the second magnetostrictive film 244b, as well as component tolerances thereof, are likely to deviate from desired positions and tolerances.

To avoid the above problem, as described above, it has heretofore been customary to make the first magnetostrictive film 244a and the second magnetostrictive film 244b so as to have a larger axial dimension than the first coil 246a and the second coil 246b, and to position the first coil 246a and the second coil 246b in alignment with respective central regions, i.e., regions of uniform thickness, of the first magnetostrictive film 244a and the second magnetostrictive film 244b, so that the midpoint voltages and gains of the first coil 246a and the second coil 246b, which are associated respectively with the first magnetostrictive film 244a and the second magnetostrictive film 244b, remain in agreement with each other.

However, there are four regions that suffer from the above thickness irregularities, i.e., two upper and lower end portions of the first magnetostrictive film 244a, and two upper and lower portions of the second magnetostrictive film 244b. In order to position the first coil 246a and the second coil 246b out of alignment with these four regions that suffer from thickness irregularities, the axial lengths of the first magnetostrictive film 244a and the second magnetostrictive film 244b need to be increased considerably, thus resulting in an increase in size of the magnetostrictive torque sensor 208, as well as the electric power steering apparatus 200 incorporating the magnetostrictive torque sensor 208 therein. One solution would be to reduce the height or axial dimension of the gap 248 between the first magnetostrictive film 244a and the second magnetostrictive film 244b. As shown in FIG. 19, the third mask 256c that forms the gap 248 comprises a pair of laterally separate semicircular mask members 258a, 258b, having respective end faces confronting each other, and being fastened to each other by two bolts 260, which are threaded through the mask member 258b into the mask member 258a. There are certain limitations on efforts to reduce the height or axial dimension of the mask members 258a, 258b, particularly in view of the dimensions of the bolts 260.

As described above, the magnetostrictive torque sensor 208 of the related art suffers significant variations in the output characteristics (gains and midpoints) thereof, and requires a mechanism and circuit for adjusting the output characteristics. Hence, the magnetostrictive torque sensor 208 tends to be complex in structure and large in size. Furthermore, since a complex masking process is required to fabricate the first magnetostrictive film 244a and the second magnetostrictive film 244b on the steering shaft 210, the process of manufacturing the magnetostrictive torque sensor 208 also is complex, and manufacturing efficiency of the magnetostrictive torque sensor 208 cannot be increased, thereby posing limitations on efforts to lower the cost of the magnetostrictive torque sensor 208.

SUMMARY OF THE INVENTION

An object of the present invention is to provide a magnetostrictive torque sensor, which is simple in structure and small in size while effectively minimizing sources of variations in output characteristics, and which will not lead to variations in output characteristics even though the axial length of a magnetostrictive film is reduced. Another object of the present invention is to provide a method of manufacturing such a magnetostrictive torque sensor.

According to a first aspect of the present invention, there is provided a magnetostrictive torque sensor comprising a shaft member, at least one magnetostrictive film disposed on the shaft member, and a plurality of coils for detecting a change in a magnetic property of the magnetostrictive film, wherein the at least one magnetostrictive film includes a plurality of different magnetic anisotropies.

With the above arrangement, characteristic variations due to the layout of the coils with respect to the magnetostrictive film can be reduced. Since it is no longer necessary to increase the axial length of the magnetostrictive film in order to reduce such characteristic variations, the magnetostrictive torque sensor can be reduced in size, and hence an apparatus incorporating the magnetostrictive torque sensor therein can also be reduced in size. Changes in output characteristics of the magnetostrictive torque sensor, which would otherwise be caused by thickness variations of the magnetostrictive film that are developed when the magnetostrictive film is formed, are effectively prevented from occurring. Therefore, the magnetostrictive torque sensor is capable of accurately detecting torsional torque applied to the shaft member.

In the magnetostrictive torque sensor according to the first aspect of the present invention, the coils may be disposed in confronting relation to a region of constant thickness of the magnetostrictive film. With this arrangement, changes in output characteristics of the magnetostrictive torque sensor, which would otherwise be caused by thickness variations of the magnetostrictive film that are developed when the magnetostrictive film is formed, are effectively prevented from occurring. Therefore, the magnetostrictive torque sensor is capable of accurately detecting torsional torque applied to the shaft member.

In the magnetostrictive torque sensor according to the first aspect of the present invention, the at least one magnetostrictive film may comprise a single magnetostrictive film disposed on the shaft member, the single magnetostrictive film may include a first anisotropic region and a second anisotropic region having respective magnetic anisotropies inverse to each other as the different magnetic anisotropies, and the coils may be disposed in confronting relation to the first anisotropic region and the second anisotropic region, respectively. Therefore, the magnetostrictive torque sensor can be applied as a torque sensor for use in an electric power steering apparatus, wherein the electric power steering apparatus is reduced in size.

In the magnetostrictive torque sensor according to the first aspect of the present invention, the at least one magnetostrictive film may be deposited on the shaft member by Ni—Fe plating. With this arrangement, regions of the magnetostrictive film that have thickness irregularities therein are confined to opposite ends thereof, whereas all other regions of the magnetostrictive film are of uniform thickness. Therefore, when the coils are installed thereon, the coils may be positioned anywhere along the magnetostrictive film except at opposite ends thereof. Furthermore, since the magnetostrictive film is free of gaps therein that divide the magnetostrictive film, the magnetostrictive film is relatively short in the axial direction. Accordingly, the magnetostrictive torque sensor can be reduced in size, and an apparatus incorporating the magnetostrictive torque sensor therein can also be reduced in size.

According to a second aspect of the present invention, there is provided a method of manufacturing a magnetostrictive torque sensor comprising a shaft member, at least one magnetostrictive film mounted on the shaft member, and a plurality of coils for detecting a change in a magnetic property of the magnetostrictive film, wherein the at least one magnetostrictive film includes a plurality of different magnetic anisotropies, the method comprising the steps of forming the at least one magnetostrictive film on a surface of the shaft member, and high-frequency heating the magnetostrictive film while a torsional torque is applied to the shaft member.

Since the magnetostrictive film can be rendered locally anisotropic, the axial length of the magnetostrictive film can be reduced. Therefore, the magnetostrictive torque sensor can be reduced in size.

In the method according to the second aspect of the present invention, the step of high-frequency heating the magnetostrictive film may further comprise a step of placing a heating coil in a position facing a first region of the magnetostrictive film on the shaft member, and high-frequency heating the first region of the magnetostrictive film while the torsional torque is applied in one direction to the shaft member, thereby developing a magnetic anisotropy in the first region of the magnetostrictive film, and a step of placing the heating coil in a position facing a second region of the magnetostrictive film on the shaft member, and high-frequency heating the second region of the magnetostrictive film while the torsional torque is applied in another direction to the shaft member, thereby developing a magnetic anisotropy in the second region of the magnetostrictive film.

The magnetostrictive film can thus have a first anisotropic region and a second anisotropic region, formed as separate local regions having magnetic anisotropies that are inverse to each other. Since the magnetostrictive film is rendered anisotropic by high-frequency heating, the first anisotropic region and the second anisotropic region can be produced as separate local regions. Since a plurality of magnetic anisotropies are developed in the magnetostrictive film while the magnetostrictive film has a reduced axial length, assuming that the magnetostrictive torque sensor is applied as a torque sensor for use in an electric power steering apparatus, the electric power steering apparatus can be reduced in size.

In the method according to the second aspect of the present invention, the step of forming the at least one magnetostrictive film on the shaft member may comprise a step of forming the at least one magnetostrictive film on a surface of the shaft member by Ni—Fe plating. With this arrangement, regions of the magnetostrictive film having thickness irregularities therein are confined to opposite ends of the magnetostrictive film, whereas all other regions of the magnetostrictive film are of uniform thickness. Therefore, when the coils are installed thereon, the coils may be positioned anywhere along the magnetostrictive film except at opposite ends thereof. Furthermore, since the magnetostrictive film is free of gaps therein that divide the magnetostrictive film, the magnetostrictive film is relatively short in the axial direction. Accordingly, the magnetostrictive torque sensor can be reduced in size, and an apparatus incorporating the magnetostrictive torque sensor therein can also be reduced in size.

With the magnetostrictive torque sensor and the method of manufacturing the magnetostrictive torque sensor according to the present invention, as described above, the magnetostrictive torque sensor is simple in structure and small in size. Also, the magnetostrictive torque sensor effectively minimizes sources of variations in output characteristics thereof, and will not produce variations in the output characteristics, even though the axial length of a magnetostrictive film is reduced.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 3 is a characteristic diagram illustrating how detected torque values (detected data) of the magnetostrictive torque sensor according to the embodiment change depending on a steering torque applied to the magnetostrictive torque sensor;

DESCRIPTION OF THE PREFERRED EMBODIMENTS

A magnetostrictive torque sensor according to an embodiment of the present invention, together with a method of manufacturing such a magnetostrictive torque sensor, will be described below with reference to FIGS. 1 through 10.

First, an electric power steering apparatus 10 incorporating a magnetostrictive torque sensor therein according to an embodiment of the present invention will be described below with reference to FIG. 1.

Figure 1:
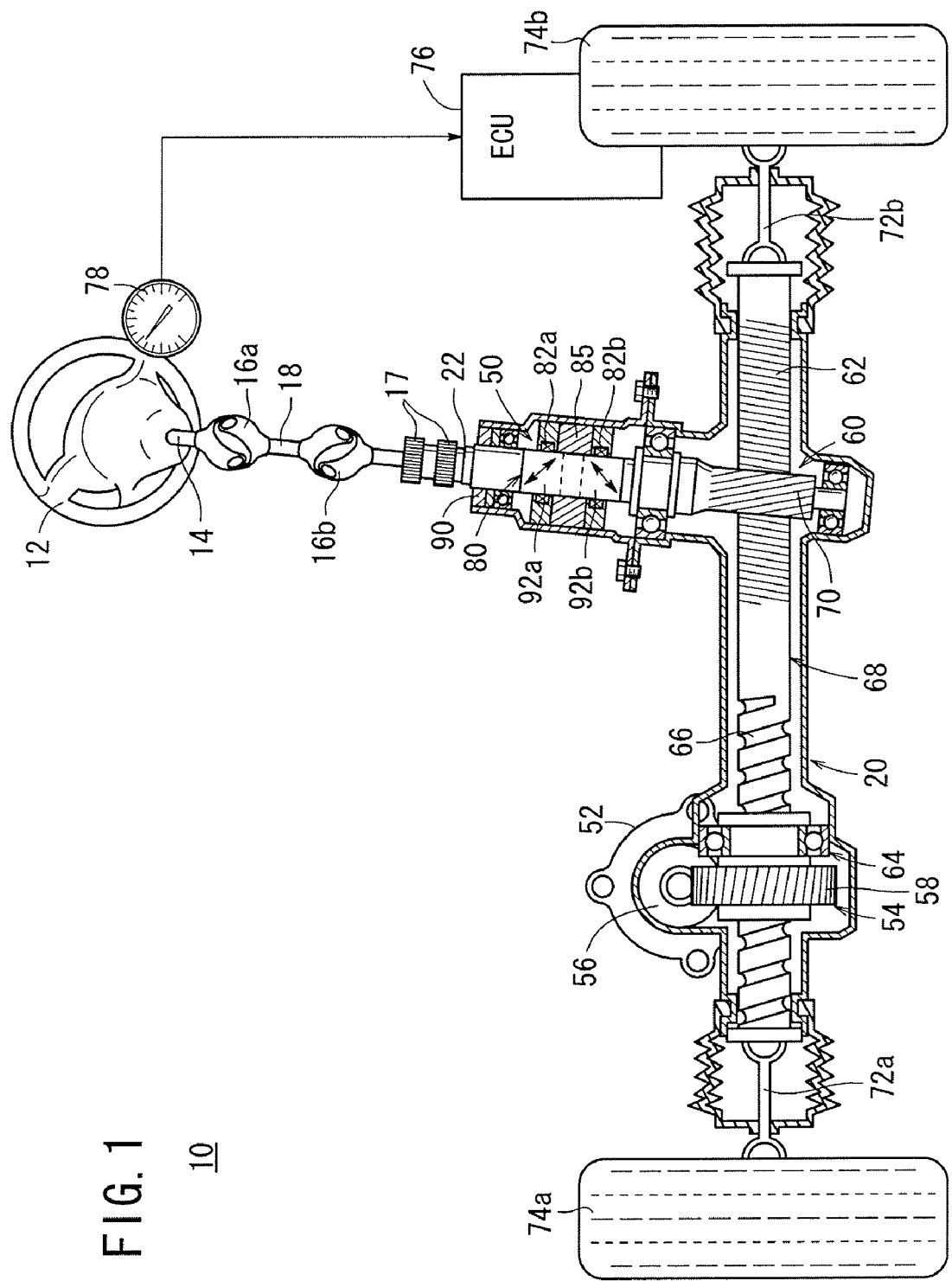
FIG. 1 is a cross-sectional view of an electric power steering apparatus incorporating a magnetostrictive torque sensor therein according to an embodiment of the present invention.

As shown in FIG. 1, the electric power steering apparatus 10 is arranged such that a steering torque and a steering angle, which are produced when the driver of a vehicle incorporating the electric power steering apparatus therein 10 turns a steering wheel 12, are applied to a steering shaft 22 of a steering gearbox 20 through a steering shaft 14, a first universal joint 16a, an intermediate shaft 18, a second universal joint 16b, and couplings 17 (e.g., serrations).

The steering gearbox 20 comprises the steering shaft 22 (shaft member), a magnetostrictive torque sensor (hereinafter also referred to as a "torque sensor") 50 according to an embodiment of the present invention for detecting the steering torque applied by the driver, a motor 52 such as a brushless motor for generating power to assist the driver in steering the vehicle, a speed reducer 54 including a worm 56 and a worm wheel 58 for increasing the rotational torque from the motor 52, a rack and pinion gear mechanism 60, and a rack shaft 68, which includes a rack gear 62 of the rack and pinion gear mechanism 60 and a screw groove 66 of a ball screw 64. The worm wheel 58 of the speed reducer 54 is fixed to the ball screw 64.

The steering wheel 12 is connected to one end of the steering shaft 22 of the steering gearbox 20 through the steering shaft 14, the first universal joint 16a, the intermediate shaft 18, and the second universal joint 16b. The other end of the steering shaft 22 comprises a pinion gear 70 of the rack and pinion gear mechanism 60.

Rotational torque produced by the motor 52 and increased by the speed reducer 54 is converted by the ball screw 64 into a thrust force, which is directed in the axial direction of the rack shaft 68. The thrust force is transmitted through tie rods 72a, 72b to left and right tires 74a, 74b of the vehicle. Depending on the steering angle of the steering wheel 12, the tires 74a, 74b turn about vertical axes thereof in order to change the direction of travel of the vehicle.

A controller 76 (ECU) controls the motor 52 based on at least a signal from the torque sensor 50 and a signal from a vehicle speed sensor 78. In FIG. 1, various signal wires, e.g., signal wires between the controller 76 and the torque sensor 50, as well as signal wires between the controller 76 and the motor 52, have been omitted from illustration.

The steering torque applied from the steering wheel 12 when the steering wheel 12 is turned by the driver is detected by the torque sensor 50. The controller 76 controls the motor 52 based on the torque signal from the torque sensor 50, as well as the signal from the vehicle speed sensor 78. The rotational torque generated by the motor 52 acts through the speed reducer 54 and the ball screw 64 on the rack shaft 68, thereby reducing the torque required for the driver to turn the steering wheel 12. In this manner, the burden imposed on the driver when turning the steering wheel 12 is reduced. In other words, the burden imposed on the driver to produce a steering torque is reduced.

In the following formulas, it is assumed that the steering torque is represented by Ts, while an assistive force $A_H$ has a coefficient $k_A$, which is constant. Since $$A_H = k_A \times Ts,$$

the load in terms of a pinion torque Tp± may be expressed by:

$$Tp = Ts + A_H$$
$$= Ts + k_A \times Ts$$

As a result, the steering torque Is may be expressed by:

$$Ts = Tp/(1+k_A)$$

Therefore, the steering torque Ts is reduced to $1/(1+k_A)$ of the pinion torque Tp when the pinion torque Tp is not assisted. In this case, $k_A > 0$ or $k_A = 0$.

As the vehicle speed goes higher, the reaction force applied from the road to the tires is reduced, and the response from the steering wheel 12 to the hands of the driver is reduced. If the coefficient $k_A$ is a function of vehicle speed and the coefficient $k_A$ becomes reduced as the vehicle speed is increased, then the response from the steering wheel 12 to the hands of the driver is prevented from becoming reduced as the vehicle speed increases. At this time as well, the steering torque Ts may be increased in order to apply a response from the steering wheel 12 to the hands of the driver.

Figure 2:
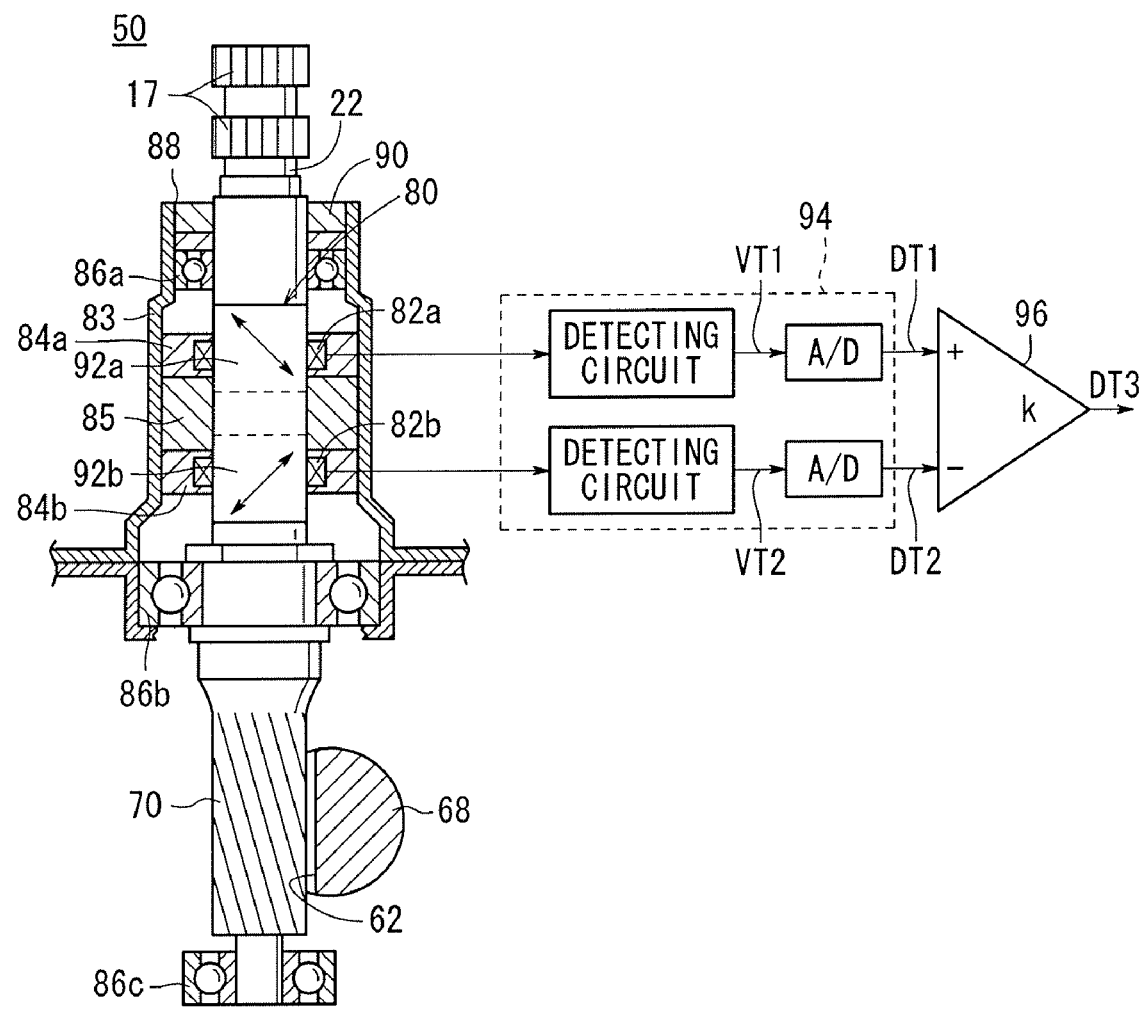
FIG. 2 is a cross-sectional view of the magnetostrictive torque sensor according to the embodiment combined with a signal processing system.

As shown in FIG. 2, the torque sensor 50 comprises a single magnetostrictive film 80 disposed on the outer circumferential surface of the steering shaft 22, a first coil 82a and a second coil 82b for detecting changes in the magnetic permeability of the magnetostrictive film 80 caused by a torsional torque applied to the steering shaft 22, and a housing 83 accommodating therein at least the steering shaft 22, the magnetostrictive film 80, the first coil 82a, and the second coil 82b. A first back yoke 84a and a second back yoke 84b, which serve as magnetic shields, are disposed respectively over the first coil 82a and the second coil 82b. A spacer 85, which also doubles as a positioner for positioning the first coil 82a and the second coil 82b, is interposed between the first back yoke 84a and the second back yoke 84b. The steering shaft 22 is rotatably supported in the housing 83 and the steering gearbox 20 by a first bearing 86a disposed closely to one end of the steering shaft 22, a second bearing 86b disposed centrally along the steering shaft 22, and a third bearing 86c disposed closely to the other end of the steering shaft 22. The housing 83 has an opening 88 close to one end of the steering shaft 22. A seal member 90 is disposed in the opening 88, thereby keeping the interior of the housing 83 and the steering gearbox 20 hermetically sealed.

The single magnetostrictive film 80 is formed on the outer circumferential surface of the steering shaft 22 near one end thereof by means of Ni—Fe plating, for example. The magnetostrictive film 80 is made of a magnetostrictive material having a positive magnetostrictive constant, which is deposited at a predetermined thickness ranging from 35 to 45 μm. The magnetostrictive film 80 includes a first anisotropic region 92a and a second anisotropic region 92b, which have magnetic anisotropic properties inverse to each other. The first anisotropic region 92a and the second anisotropic region 92b are produced by applying a certain torsional torque to the magnetostrictive film 80 through the steering shaft 22, heating the magnetostrictive film 80 by high-frequency heating, and then cooling the magnetostrictive film 80 to room temperature and removing the torsional torque from the magnetostrictive film 80. Since the magnetostrictive film 80 includes the first anisotropic region 92a and the second anisotropic region 92b, even when a torsional torque is not applied to the magnetostrictive film 80, the magnetostrictive film 80 continuously undergoes tensile stress and develops tensile strain therein, resulting in reduced hysteresis in the inverse magnetostrictive properties of the magnetostrictive film 80. After the steering shaft 22 is machined, the outer circumferential surface of the steering shaft 22, on which the magnetostrictive film 80 is formed, is cleaned with an alkaline solution, water, an acid solution, or the like. Therefore, the magnetostrictive film 80 is held in highly intimate contact with the outer circumferential surface of the steering shaft 22.

The first coil 82a is disposed around the first anisotropic region 92a in confronting relation thereto and with a small gap interposed therebetween. Similarly, the second coil 82b is disposed around the second anisotropic region 92b in confronting relation thereto and with a small gap interposed therebetween. When a torsional torque is applied to the steering shaft 22, the torsional torque also is applied to the first anisotropic region 92a and the second anisotropic region 92b, which develop corresponding inverse magnetostriction effects therein depending on the applied torsional torque. When the controller 76 applies high-frequency alternating voltages (exciting voltages) to the first coil 82a and the second coil 82b through connectors, not shown, changes caused in the magnetic field, which are caused by the inverse magnetostriction effects of the first anisotropic region 92a and the second anisotropic region 92b based on the applied torsional torque, are detected as changes in impedance, or as changes in voltage induced across the first coil 82a and the second coil 82b. Since not only torsional torque, but also tensile stress, is applied to the magnetostrictive film 80 at this time, the torque sensor 50 provides output characteristics with reduced hysteresis. Accordingly, the torque sensor 50 can detect the torsional torque applied to the steering shaft 22 based on changes in impedance or changes in induced voltage.

More specifically, when alternating electric currents are supplied to the first coil 82a and the second coil 82b, changes caused in the magnetic permeabilities of the first anisotropic region 92a and the second anisotropic region 92b of the magnetostrictive film 80, which depend on the applied torsional torque, are detected as impedance changes. The impedance changes are then converted into a first detected voltage VT1 and a second detected voltage VT2 by detecting circuits of an interface 94. The first detected voltage VT1 and the second detected voltage VT2 then are converted into first detected data DT1 and second detected data DT2, respectively, by A/D converters of the interface 94. The interface 94 may be included in the controller 76, or may be provided within the housing 83.

Changes in the magnetic permeabilities, i.e., the first detected voltage VT1 and the second detected voltage VT2, are read into an arithmetic unit 96 of the controller 76 through the interface 94. The arithmetic unit 96 then calculates digital data (detected torque data DT3), represented by the characteristic curve shown in FIG. 3, from the first detected data DT1 and the second detected data DT2. The torque data DT3 is calculated according to the following equation:

$$DT3 = k \cdot (DT1 - DT2) + Da$$

where k represents a proportionality constant.

The controller 76 controls the motor 52 based on the calculated detected torque data DT3, as described above.

Since the single magnetostrictive film 80 of the torque sensor 50 includes a plurality of different magnetic anisotropies, i.e., the first anisotropic region 92a and the second anisotropic region 92b, characteristic variations due to the layout of the first coil 82a and the second coil 82b with respect to the magnetostrictive film 80 can be reduced. Since the axial length of the magnetostrictive film 80 does not have to be increased in order to reduce the characteristic variations, the torque sensor 50 can be reduced in size, and hence the electric power steering apparatus 10, which incorporates the torque sensor 50 therein, can also be reduced in size.

The first coil 82a and the second coil 82b are disposed in confronting relation to respective regions of uniform thickness of the first anisotropic region 92a and the second anisotropic region 92b. Therefore, changes in the output characteristics of the torque sensor 50, which would otherwise be caused by thickness variations of the magnetostrictive film 80 developed when the magnetostrictive film 80 is formed, are effectively prevented from occurring. Therefore, the torque sensor 50 is capable of accurately detecting torsional torque applied to the steering shaft 22.

Figure 11:
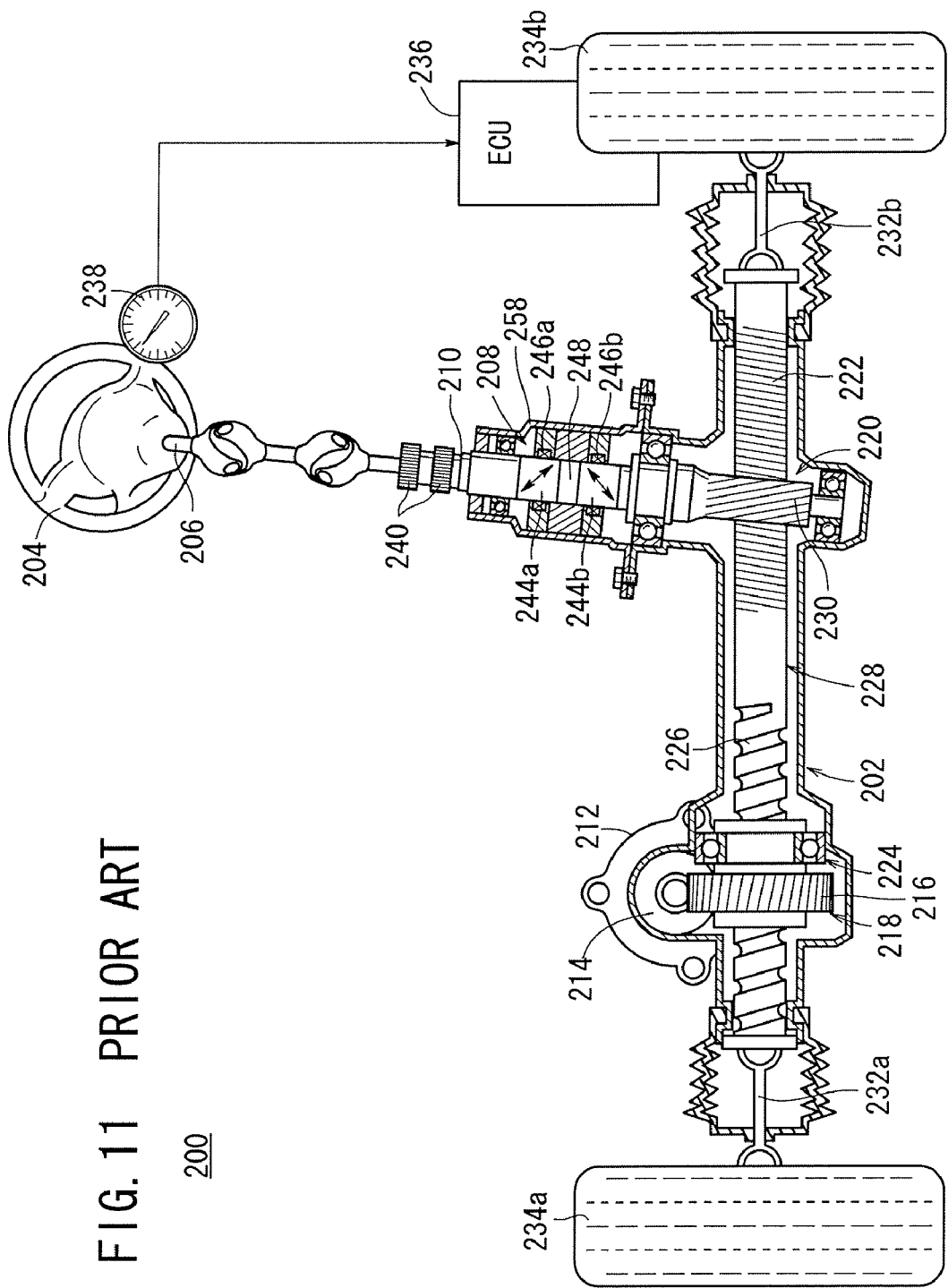
FIG. 11 is a cross-sectional view of an electric power steering apparatus incorporating a magnetostrictive torque sensor therein according to the related art.
Figure 12:
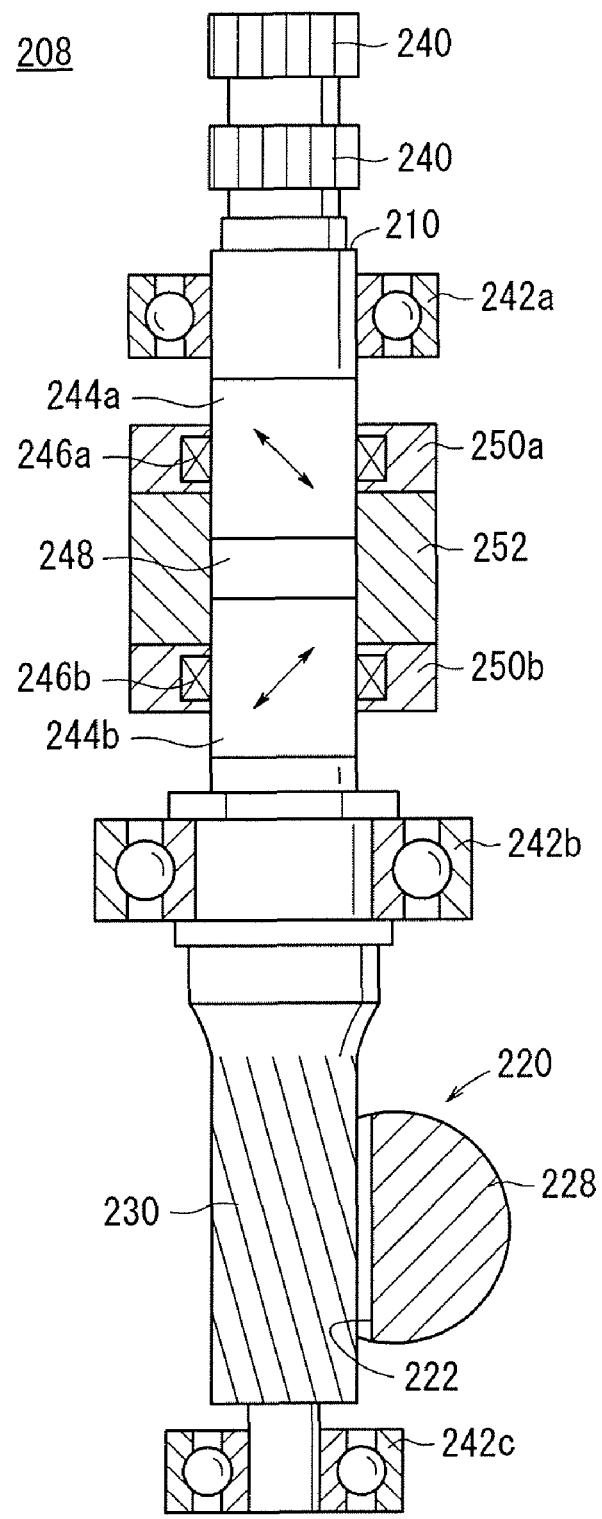
FIG. 12 is a side-elevational view, partially omitted from illustration, of the magnetostrictive torque sensor according to the related art.
Figure 13:
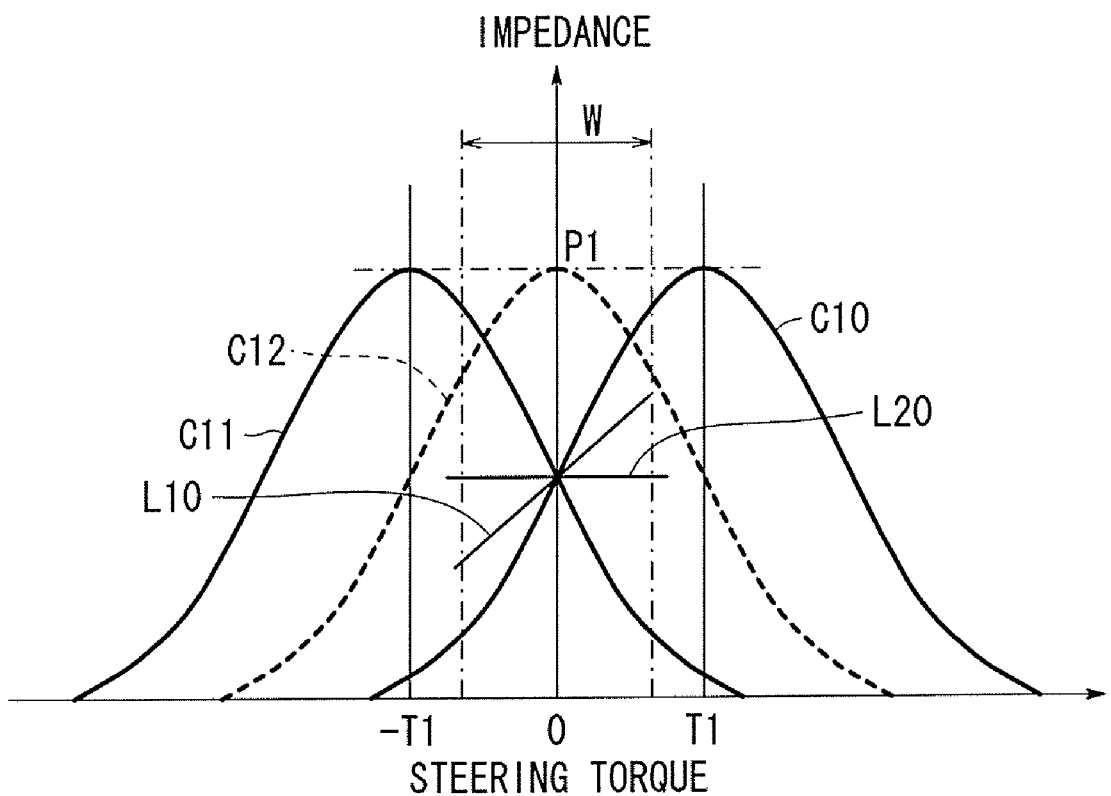
FIG. 13 is a characteristic diagram illustrating how impedances of detecting coils change depending on the steering torque applied to the magnetostrictive torque sensor according to the related art.
Figure 14B:
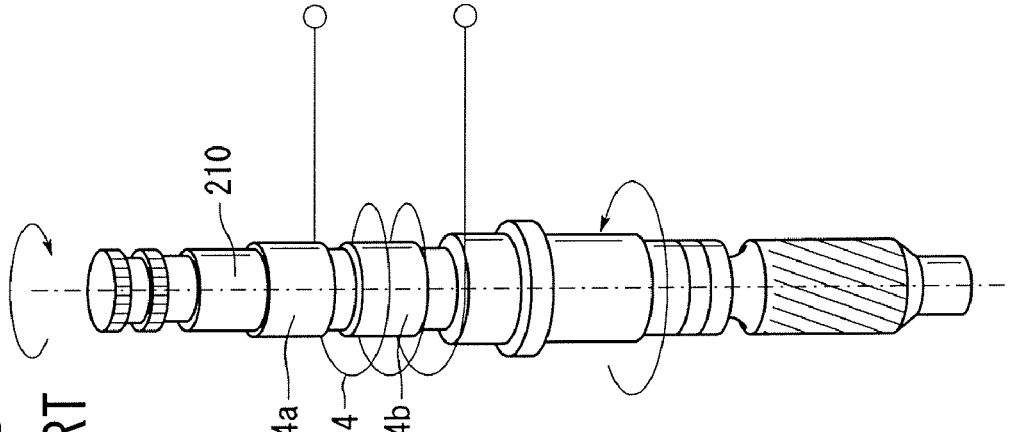
FIG. 14B is a perspective view showing a process of rendering a second magnetostrictive film anisotropic in the magnetostrictive torque sensor according to the related art.
Figure 14A:
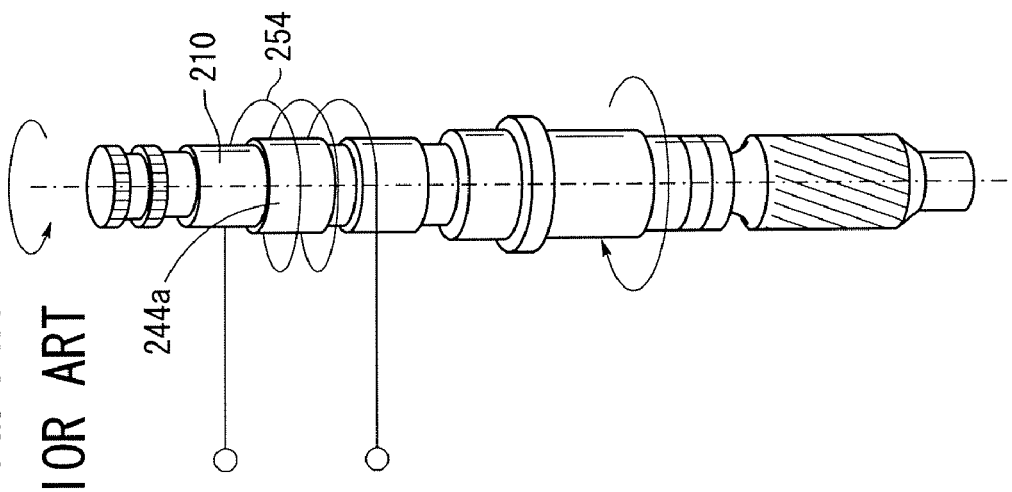
FIG. 14A is a perspective view showing a process of rendering a first magnetostrictive film anisotropic in the magnetostrictive torque sensor according to the related art.

According to the present invention, regions of the magnetostrictive film 80 having thickness irregularities therein are confined to opposite ends of the magnetostrictive film 80, whereas all other regions of the magnetostrictive film 80 are of uniform thickness. Therefore, when the first coil 82a and the second coil 82b are installed, the first coil 82a and the second coil 82b may be positioned anywhere along the magnetostrictive film 80, except at opposite ends thereof. Furthermore, since no gap (corresponding to the gap 248 shown in FIGS. 11 and 12) exists therein for dividing the magnetostrictive film, the magnetostrictive film 80 is relatively short in the axial direction thereof. Accordingly, the torque sensor 50 can be reduced in size, and hence the electric power steering apparatus 10 incorporating the torque sensor 50 therein can also be reduced in size.

A comparison between the magnetostrictive torque sensor 50 according to the present embodiment and the magnetostrictive torque sensor 208 according to the related art will be described below.

Figure 4A:
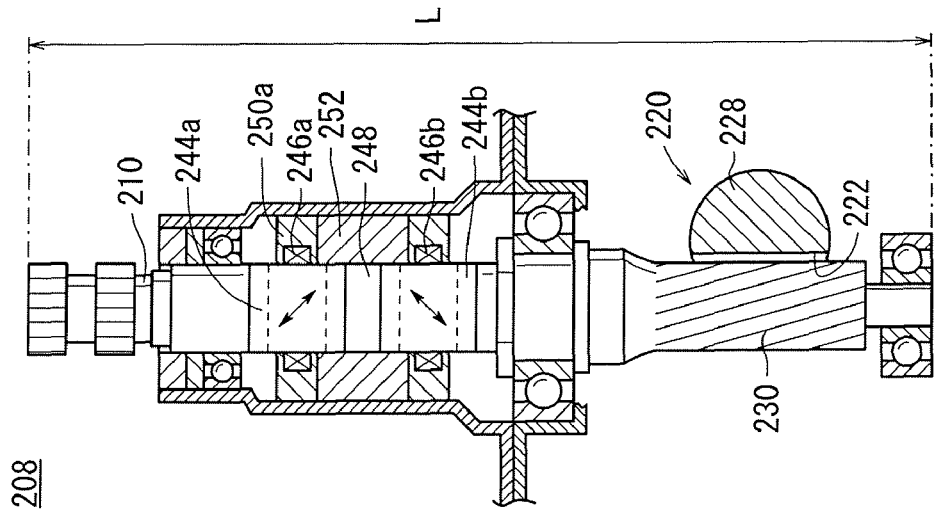
FIG. 4A is a cross-sectional view, partially omitted from illustration, of the magnetostrictive torque sensor according to the embodiment.
Figure 4B:
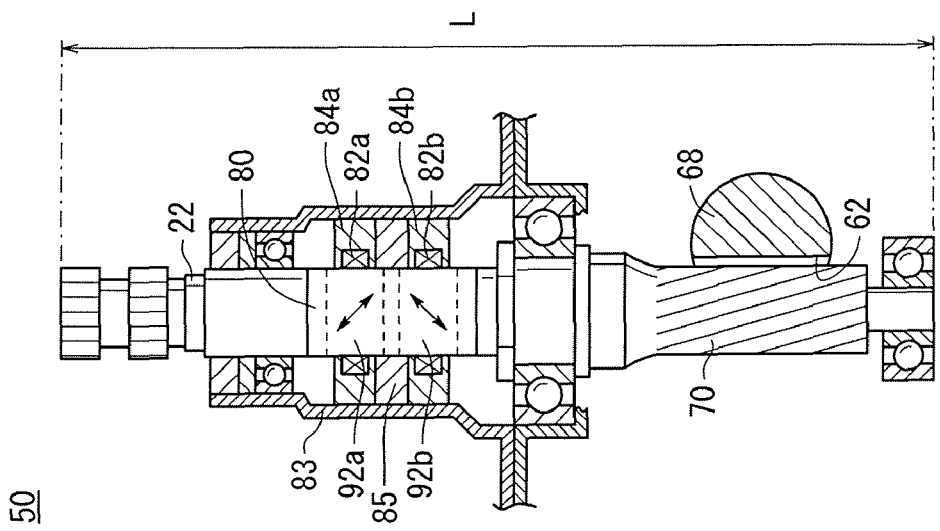
FIG. 4B is a cross-sectional view, partially omitted from illustration, of a magnetostrictive torque sensor according to the related art.
Figure 15:
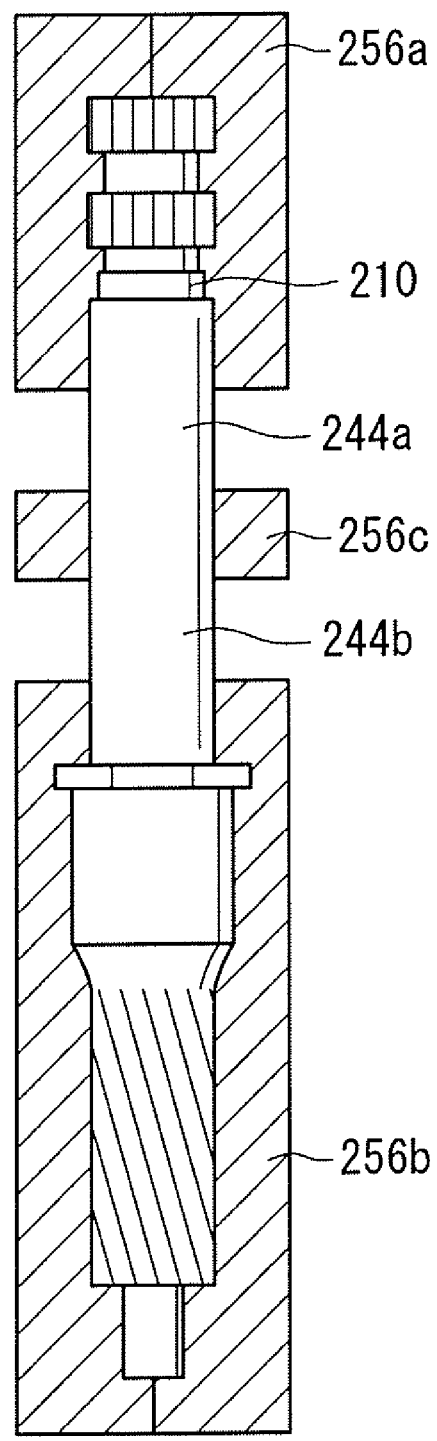
FIG. 15 is a view showing a steering shaft with magnetostrictive films formed thereon by using masks on the steering shaft in the magnetostrictive torque sensor according to the related art.
Figure 16A:
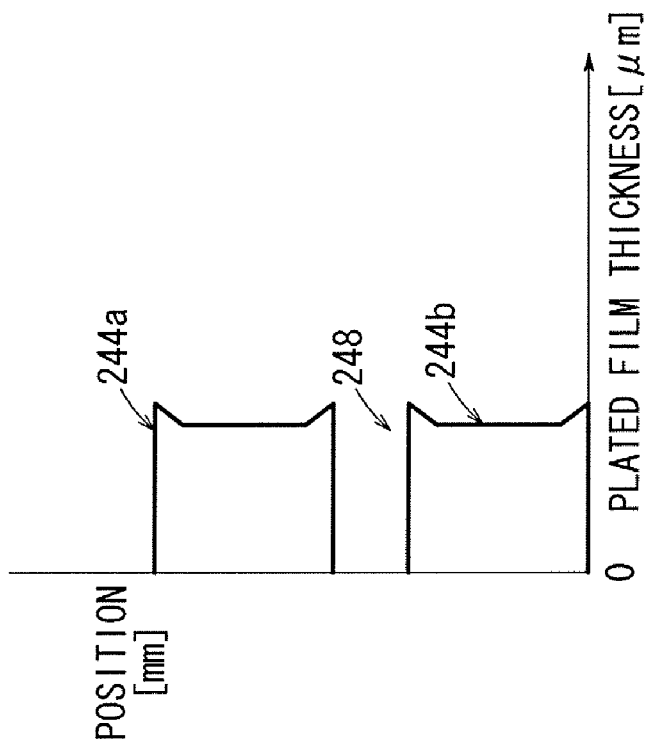
FIG. 16A is a characteristic diagram illustrating axial variations in electric current density on surfaces of a first magnetostrictive film and a second magnetostrictive film, which are plated on the steering shaft in the magnetostrictive torque sensor according to the related art.
Figure 16B:
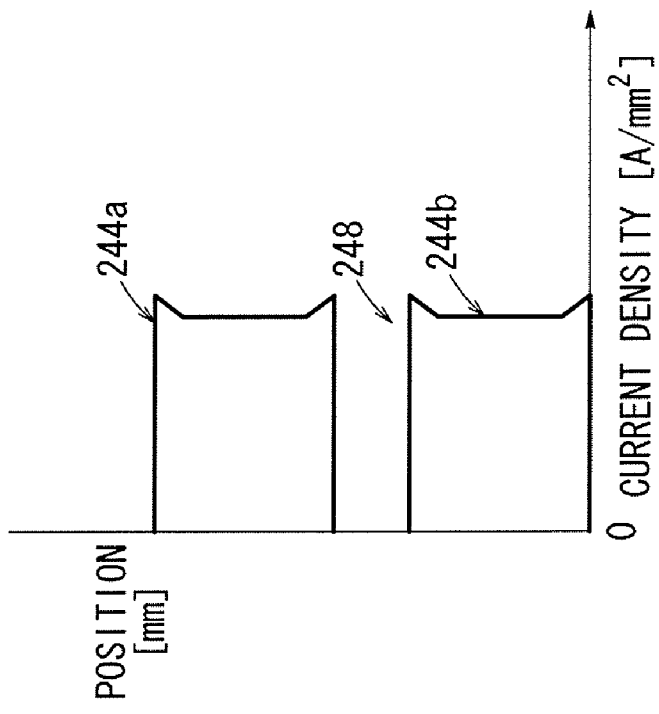
FIG. 16B is a characteristic diagram illustrating axial variations in thicknesses of the first magnetostrictive film and the second magnetostrictive film in the magnetostrictive torque sensor according to the related art.
Figure 17:
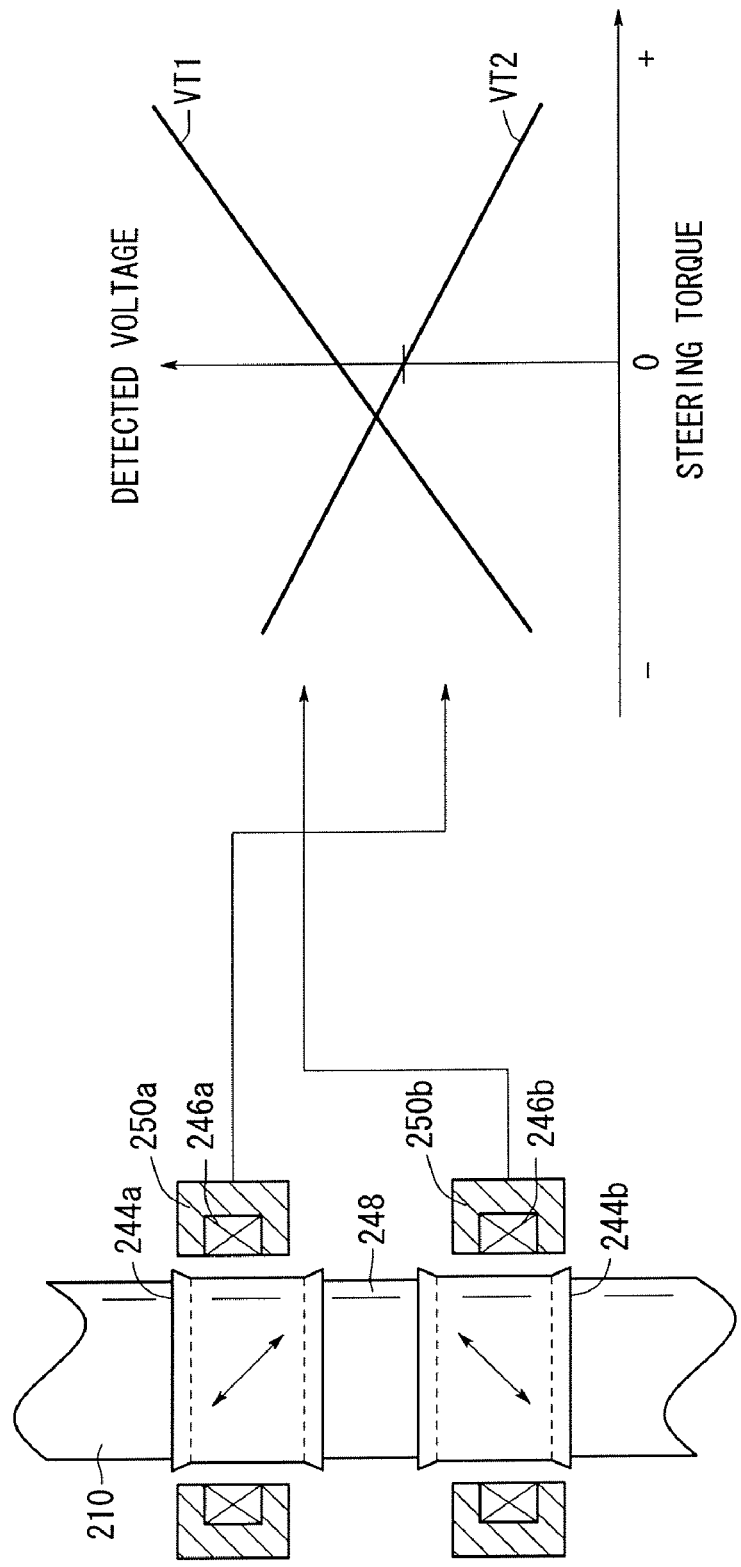
FIG. 17 is a diagram showing output characteristics of the magnetostrictive torque sensor according to the related art, where a first coil and a second coil are positioned in confronting relation to thickness irregularities of the first magnetostrictive film and the second magnetostrictive film.
Figure 18:
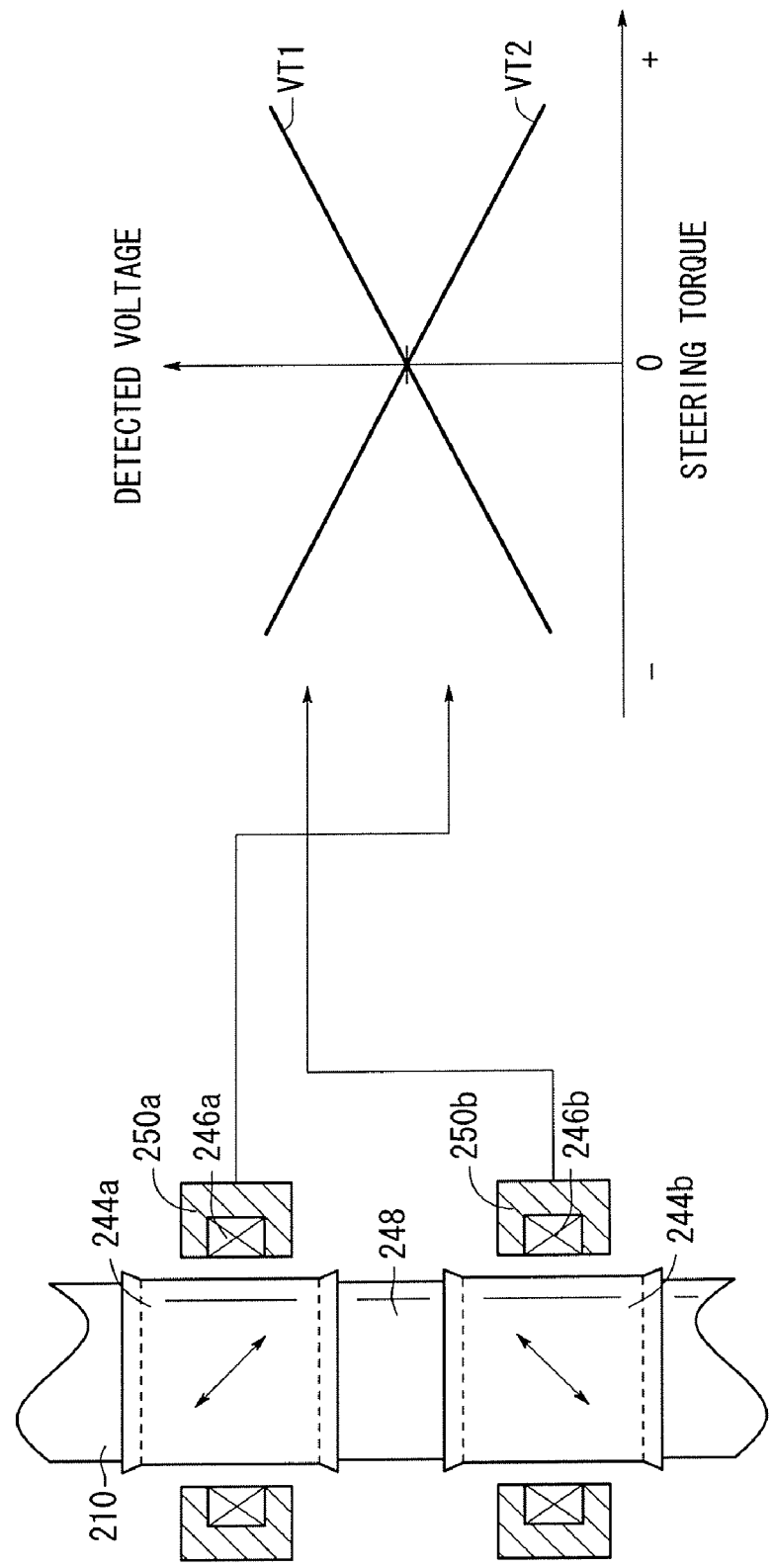
FIG. 18 is a diagram showing output characteristics of the magnetostrictive torque sensor according to the related art, where the first coil and the second coil are positioned in confronting relation to regions of uniform thickness of the first magnetostrictive film and the second magnetostrictive film.

FIG. 4B shows in cross section the magnetostrictive torque sensor 208 according to the related art. As shown in FIG. 4B, in order to produce the first magnetostrictive film 244a and the second magnetostrictive film 244b on the steering shaft 210 by means of Ni—Fe plating, the steering shaft 210 is selectively masked using the first mask 256a, the second mask 256b, and the third mask 256c, as shown in FIG. 15. Then the steering shaft 210 is dipped into a plating solution to carry out electrolytic plating, thereby forming the first magnetostrictive film 244a and the second magnetostrictive film 244b on the steering shaft 210. Since electric lines of force are concentrated at the boundaries of the first mask 256a, the second mask 256b, and the third mask 256c on the steering shaft 210, which is an electric conductor, the electric current density that flows in the plating process is higher at those boundaries. Consequently, the thickness at the boundaries, i.e., at axially upper and lower ends of the first magnetostrictive film 244a and the second magnetostrictive film 244b, becomes increased and irregular. As shown in FIG. 17, if the first coil 246a and the second coil 246b are positioned in confronting relation to such regions having thickness irregularities of the first magnetostrictive film 244a and the second magnetostrictive film 244b, then the output characteristics of the magnetostrictive torque sensor 208, for example, the midpoint voltages and gains of the first coil 246a and the second coil 246b, which are associated respectively with the first magnetostrictive film 244a and the second magnetostrictive film 244b, become different from each other.

In order to avoid the above problem, it has heretofore been customary to make the first magnetostrictive film 244a and the second magnetostrictive film 244b larger in axial dimension than the first coil 246a and the second coil 246b, and to position the first coil 246a and the second coil 246b in alignment with respective central regions (where the film thickness is uniform) of the first magnetostrictive film 244a and the second magnetostrictive film 244b. However, four different regions suffer from the above thickness irregularities, i.e., two upper and lower end portions of the first magnetostrictive film 244a, and two upper and lower portions of the second magnetostrictive film 244b. In order to position the first coil 246a and the second coil 246b out of alignment with these four regions that suffer from thickness irregularities, the axial length of the first magnetostrictive film 244a and the second magnetostrictive film 244b must be increased considerably. The gap 248 between the first magnetostrictive film 244a and the two upper and lower portions of the second magnetostrictive film 244b cannot be reduced significantly, in view of the presence of the third mask 256c. Therefore, as shown in FIG. 4B, the magnetostrictive torque sensor 208 has a large overall length L, thus increasing the size of the electric power steering apparatus which incorporates the magnetostrictive torque sensor 208 therein.

Figure 7:
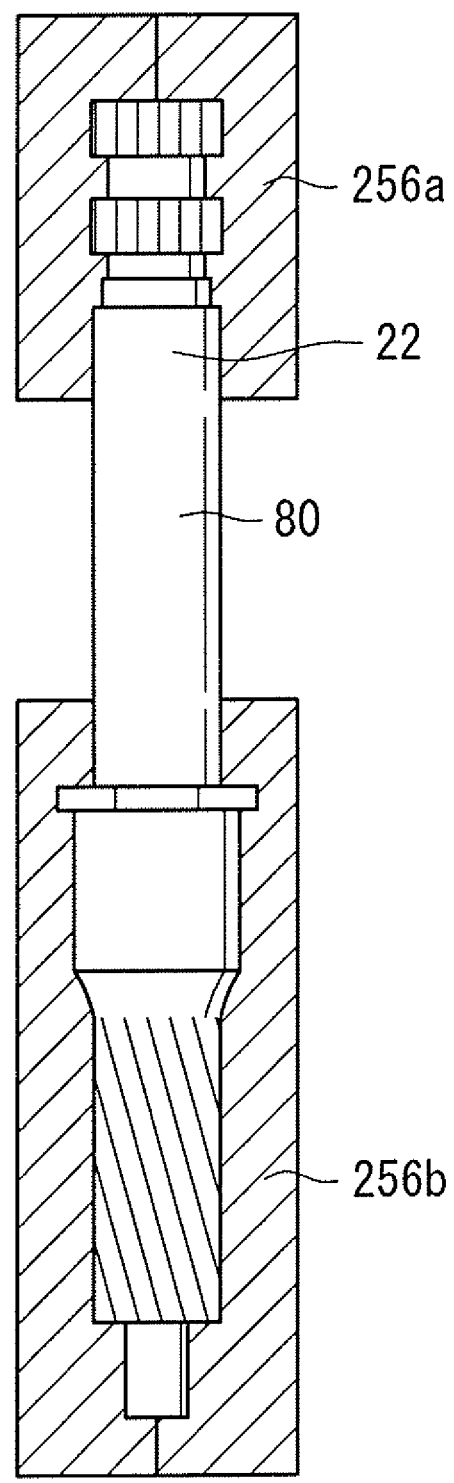
FIG. 7 is a view showing a steering shaft selectively masked, and a magnetostrictive film formed thereon.

FIG. 4A shows in cross section the magnetostrictive torque sensor 50 according to the present embodiment. As shown in FIG. 4A, the magnetostrictive torque sensor 50 includes the single magnetostrictive film 80, which is disposed on the outer circumferential surface of the steering shaft 22. The single magnetostrictive film 80 includes a plurality of different magnetic anisotropies, i.e., the first anisotropic region 92a and the second anisotropic region 92b. As shown in FIG. 7, for producing the magnetostrictive film 80, the steering shaft 22 may selectively be masked by a first mask 256a and a second mask 256b. The third mask 256c (FIG. 15) is not required. Thus, regions of the magnetostrictive film 80 having thickness irregularities are confined solely to the upper and lower ends of the magnetostrictive film 80. Since the first coil 82a and the second coil 82b may be positioned anywhere along the magnetostrictive film 80, except at upper and lower ends thereof, the axial length of the magnetostrictive film 80 can be reduced. Therefore, the overall length L of the magnetostrictive torque sensor 50 (see FIG. 4A) can be made smaller than that of the magnetostrictive torque sensor 208 (see FIG. 4B).

Differences between specific dimensions of the magnetostrictive torque sensor 50 according to the present embodiment and the magnetostrictive torque sensor 208 according to the related art will be described below.

Figure 5B:
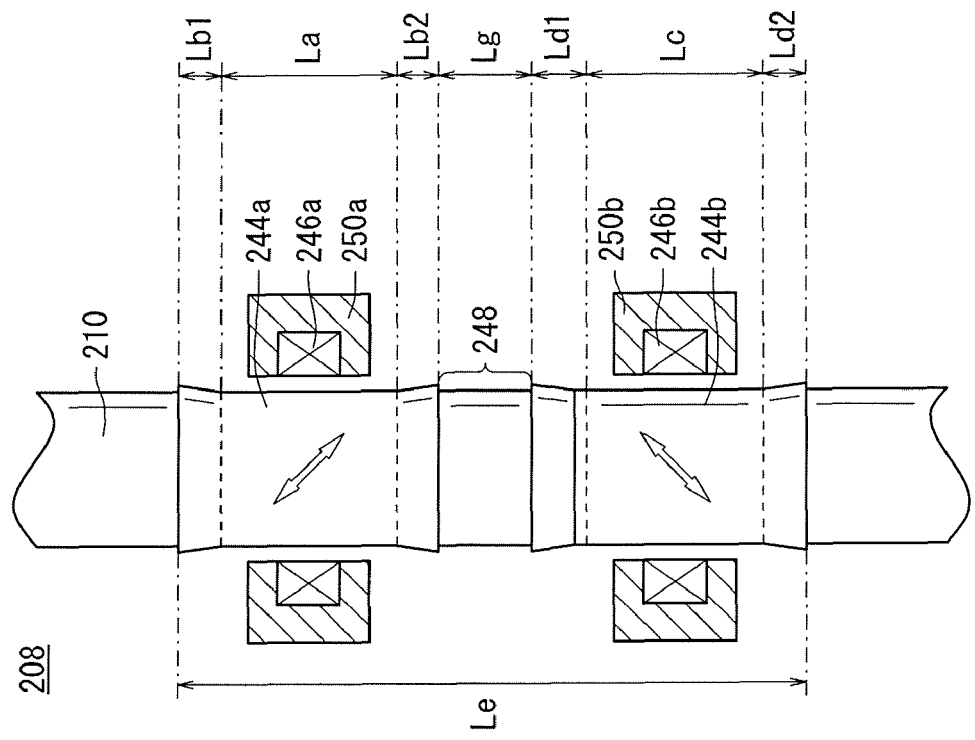
FIG. 5B is a side elevational view, partially omitted from illustration, of the magnetostrictive torque sensor according to the related art.
Figure 19:
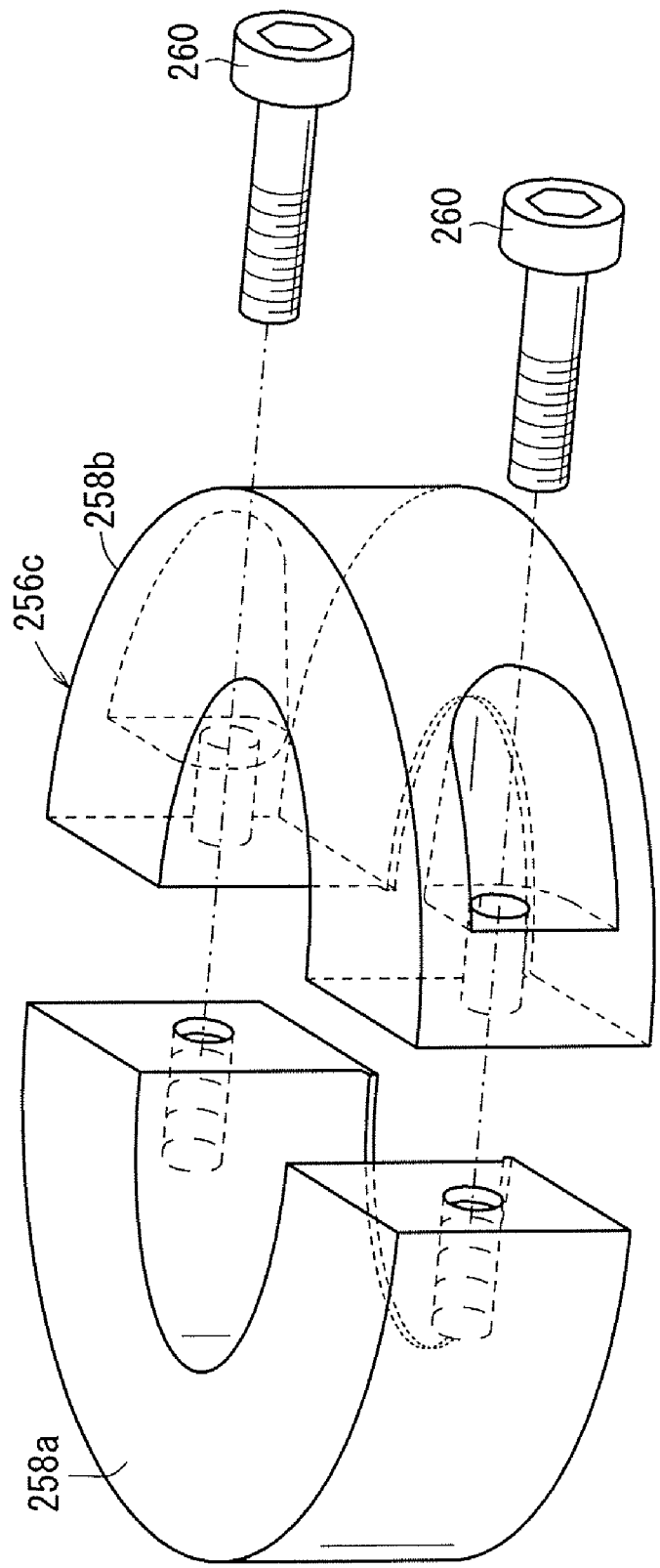
FIG. 19 is an exploded perspective view of a third mask, which is used for forming a gap between the first magnetostrictive film and the second magnetostrictive film in the magnetostrictive torque sensor according to the related art.

As shown in FIG. 5B, in the magnetostrictive torque sensor 208 according to the related art, the region of the first magnetostrictive film 244a having a uniform thickness has an axial length La ranging from 8 to 10 mm, in view of possible positional misalignment thereof with the first coil 246a. Further, regions of the first magnetostrictive film 244a having thickness irregularities therein, i.e., the upper and lower end portions thereof, have respective axial lengths Lb1 and Lb2, each of which ranges from 1 to 2 mm. The region of the second magnetostrictive film 244b having a uniform thickness has an axial length Lc ranging from 8 to 10 mm, in view of possible positional misalignment thereof with the second coil 246b. Further, regions of the second magnetostrictive film 244b having thickness irregularities therein, i.e., the upper and lower end portions thereof, have respective axial lengths Ld1 and Ld2, each of which ranges from 1 to 2 mm. The gap 248 between the first magnetostrictive film 244a and the second magnetostrictive film 244b has an axial length Lg ranging from 7 to 10 mm, as governed by the axial dimension of the third mask 256c (see FIG. 19). Therefore, the overall length L from the upper end of the first magnetostrictive film 244a to the lower end of the second magnetostrictive film 244b lies within a range from 27 to 38 mm.

Figure 5A:
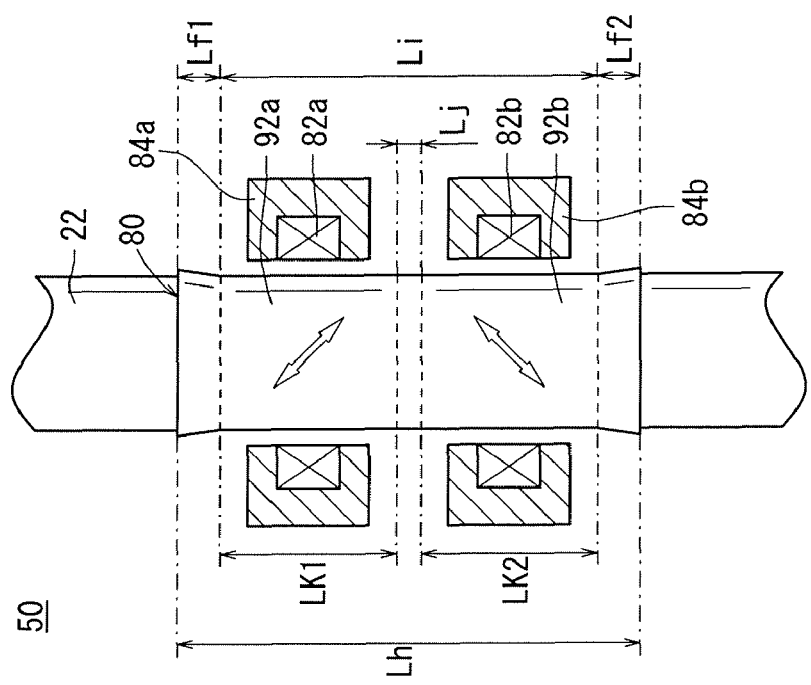
FIG. 5A is a side elevational view, partially omitted from illustration, of the magnetostrictive torque sensor according to the embodiment.

In contrast thereto, as shown in FIG. 5A, in the magnetostrictive torque sensor 50 according to the present embodiment, regions of the magnetostrictive film 80 having thickness irregularities therein, i.e., the upper and lower end portions thereof, have respective axial lengths Lf1 and Lf2, each of which ranges from 1 to 2 mm. Therefore, the region of the magnetostrictive film 80 having uniform thickness has an axial length Li, which is of a value produced by subtracting 2 to 4 mm from the overall length Lh of the magnetostrictive film 80. Since the axially central region of the magnetostrictive film 80 requires a length Lj (=1 through 2 mm) large enough to distinguish different magnetic anisotropies from each other, the first anisotropic region 92*a* is set to an axial length Lk1 ranging from 8 to 10 mm, in view of possible positional misalignment thereof with the first coil 82*a*. Similarly, the second anisotropic region 92*b* is set to an axial length Lk2 ranging from 8 to 10 mm, in view of possible positional misalignment thereof with the second coil 82*b*. Therefore, the overall length Lh from the upper end to the lower end of the magnetostrictive film 80 lies within a range from 19 to 26 mm, which is much smaller than the overall length L from the upper end of the first magnetostrictive film 244*a* to the lower end of the second magnetostrictive film 244*b* of the magnetostrictive torque sensor 208 according to the related art.

According to the present embodiment, as described above, the axial length of the magnetostrictive film 80 of the magnetostrictive torque sensor 50 is much smaller than the overall axial length of the first and second magnetostrictive films 244*a*, 244*b* including the gap 248 of the magnetostrictive torque sensor 208, according to the related art. As a result, the steering shaft 22 on which the magnetostrictive film 80 is mounted can be made much smaller in overall axial length. Further, the electric power steering apparatus 10 incorporating the magnetostrictive torque sensor 50 therein can be made much smaller in size than the electric power steering apparatus according to the related art.

A method of manufacturing the magnetostrictive torque sensor 50 according to the present embodiment will be described below with reference to FIGS. 6 through 10.

Figure 6:
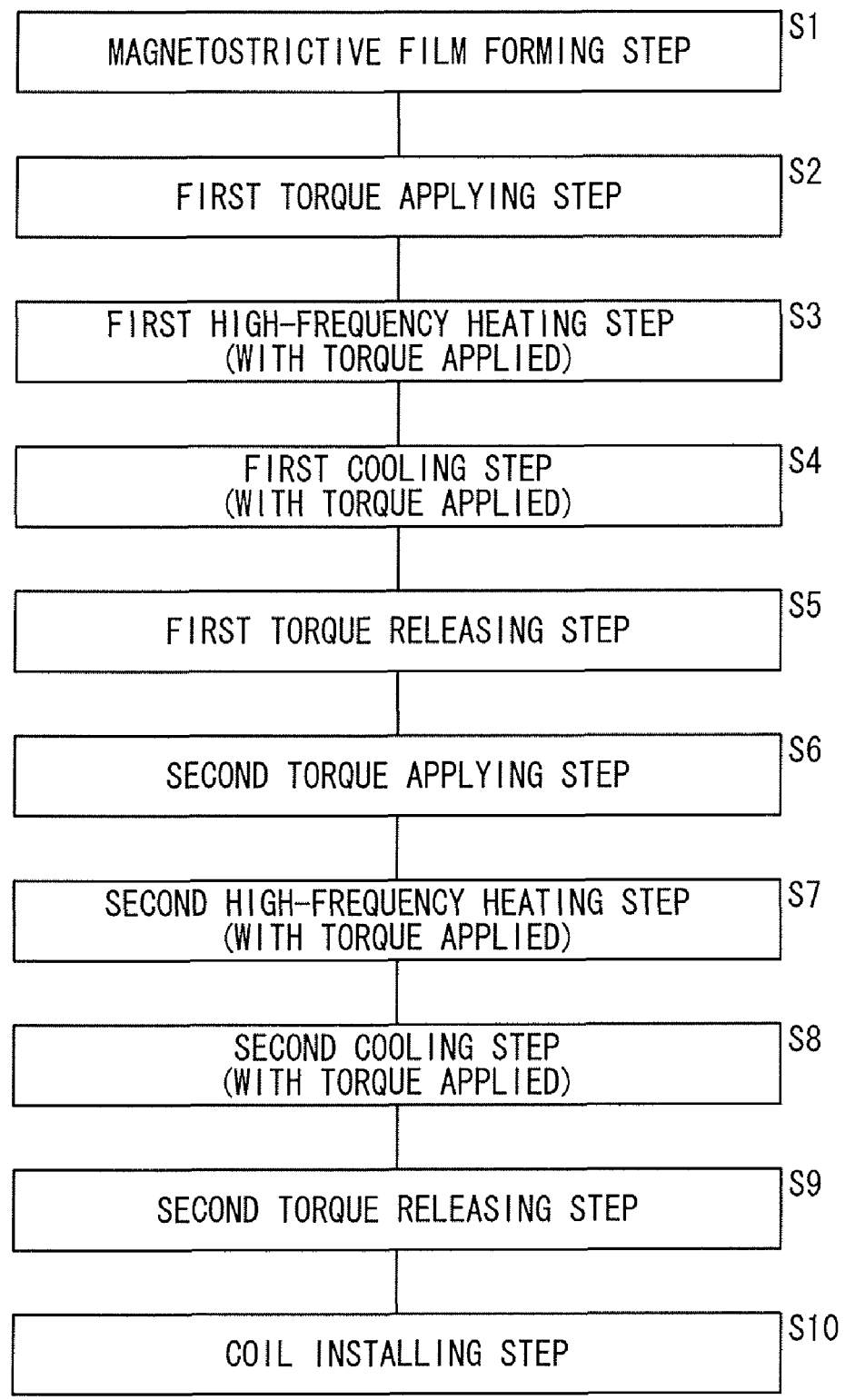
FIG. 6 is a flowchart of a method of manufacturing the magnetostrictive torque sensor according to the embodiment.

As shown in FIG. 6, the method of manufacturing the magnetostrictive torque sensor 50 according to the present embodiment comprises a magnetostrictive film forming step S1, a first torque applying step S2, a first high-frequency heating step S3, which is carried out during the first torque applying step S2, a first cooling step S4, which is carried out during the first torque applying step S2, a first torque releasing step S5, a second torque applying step S6, a second high-frequency heating step S7, which is carried out during the second torque applying step S6, a second cooling step S8, which is carried out during the second torque applying step S6, a second torque releasing step S9, and a coil installing step S10.

In the magnetostrictive film forming step S1, as shown in FIG. 7, a first mask 256*a* is placed in covering relation to an end portion of the steering shaft 22, and a second mask 256*b* is placed in covering relation to a portion of the steering shaft 22, so as to extend from an opposite end toward an axially central region thereof, thereby exposing a region of the steering shaft 22 where the magnetostrictive film 80 is to be formed. The third mask 256*c*, which is used according to the related art, is not required. Then, the steering shaft 22, having been masked by the first mask 256*a* and the second mask 256*b*, is dipped into a plating solution and is electrolytically plated by means of Ni—Fe plating, for example, thereby depositing the magnetostrictive film 80 at a thickness of about 40 μm on the exposed region of the steering shaft 22.

Figure 8A:
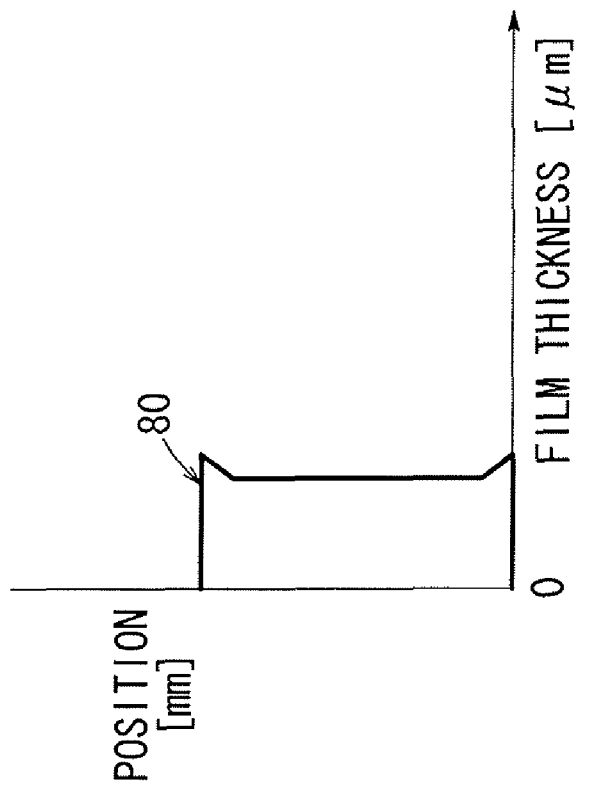
FIG. 8A is a characteristic diagram illustrating axial variations in electric current density on the surface of the magnetostrictive film, when the magnetostrictive film is plated on the steering shaft.
Figure 8B:
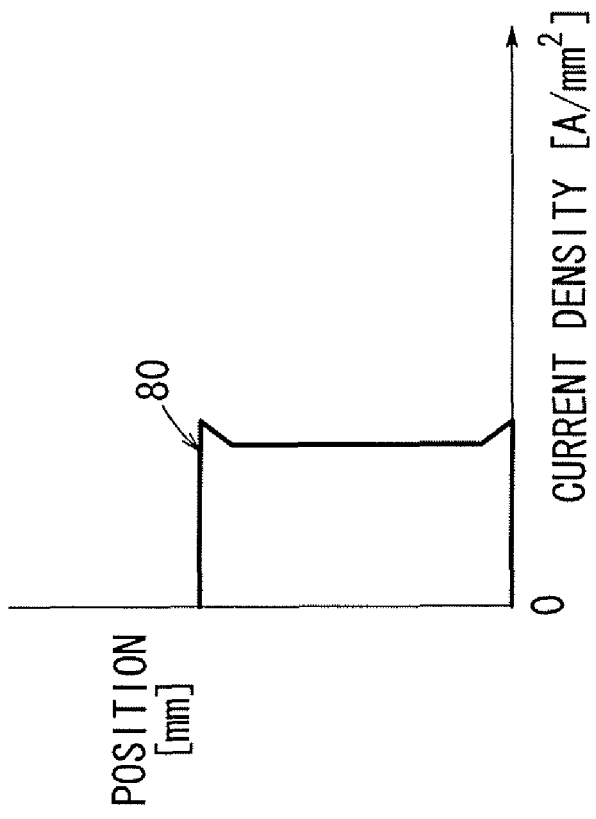
FIG. 8B is a characteristic diagram illustrating axial variations in thickness of the magnetostrictive film.

In the above plating process, electric lines of force are concentrated at boundaries of the first mask 256*a* and the second mask 256*b* on the steering shaft 210. Therefore, as shown in FIG. 8A, the electric current density that flows in the plating process is higher at axial upper and lower ends of the exposed region of the steering shaft 22 where the magnetostrictive film 80 is formed. As a consequence, as shown in FIG. 8B, the axial upper and lower ends of the magnetostrictive film 80 have a large local thickness, and hence regions having thickness irregularities therein are produced.

In the first torque applying step S2, a torsional torque is applied in one direction to the steering shaft 22 as well as to the magnetostrictive film 80. Assuming that the magnetostrictive film 80 is chiefly made of iron and nickel, the applied torsional torque lies within a range from 50 Nm to 100 Nm.

Figure 9A:
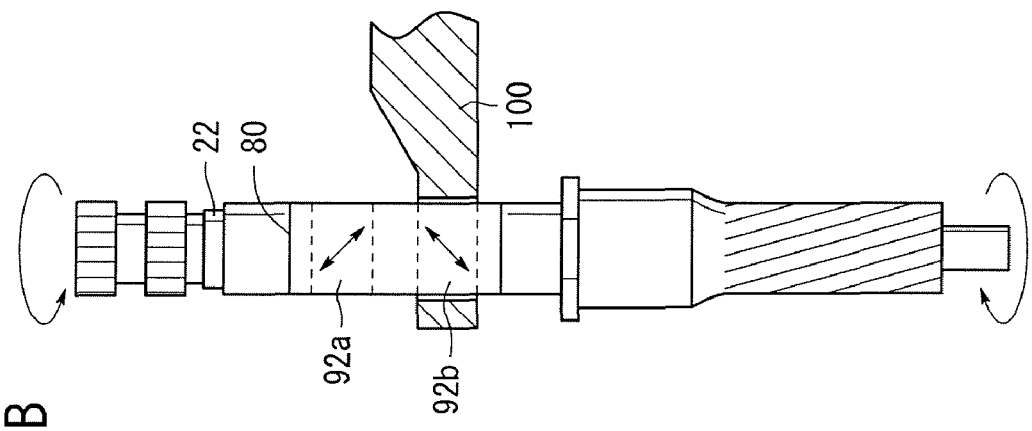
FIG. 9A is a view showing the manner in which an upper portion of the steering shaft is heated by high-frequency heating.

In the first high-frequency heating step S3, which is carried out during the first torque applying step S2, as shown in FIG. 9A, after the first mask 256*a* and the second mask 256*b* have been removed, the steering shaft 22 is heat-treated while a torsional torque is applied thereto, for the purpose of imparting magnetic anisotropy in a certain direction to an upper portion of the magnetostrictive film 80. More specifically, the upper portion of the magnetostrictive film 80 is surrounded by a heating coil 100, and a high-frequency electric current is passed through the heating coil 100 in order to heat the upper portion of the magnetostrictive film 80 for a given period of time.

In the first cooling step S4, which is carried out during the first torque applying step S2, the steering shaft 22 is cooled down to normal temperature while the torsional torque continues to be applied thereto.

In the first torque releasing step S5, the torsional torque is removed from the steering shaft 22 as well as the magnetostrictive film 80, thereby rendering the magnetostrictive film 80 magnetically anisotropic. In this manner, the first anisotropic region 92*a* is developed in the upper portion of the magnetostrictive film 80.

In the second torque applying step S6, a torsional torque is applied to the steering shaft 22 as well as to the magnetostrictive film 80 in an opposite direction, i.e., in a direction opposite to the direction in which the torsional torque was applied in the first torque applying step S2. The applied torsional torque lies within a range from 50 Nm to 100 Nm.

Figure 9B:
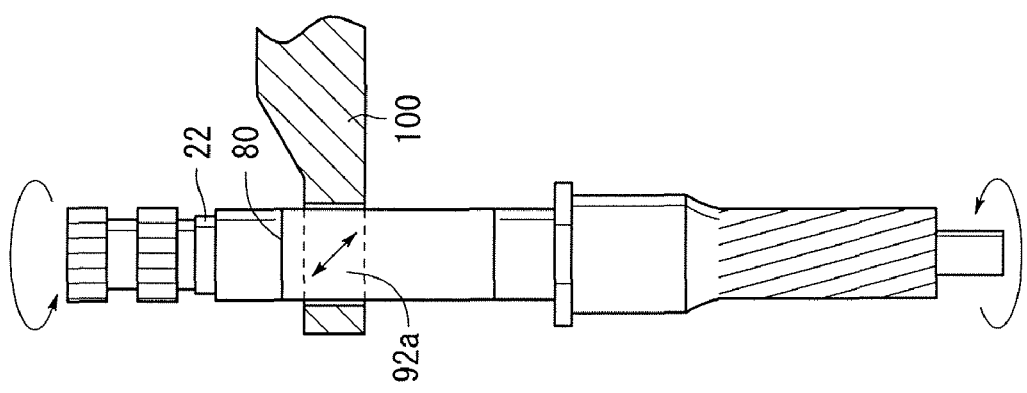
FIG. 9B is a view showing the manner in which a lower portion of the steering shaft is heated by high-frequency heating.

In the second high-frequency heating step S7, which is carried out during the second torque applying step S6, as shown in FIG. 9B, the steering shaft 22 is heat-treated while a torsional torque is applied thereto, for the purpose of imparting magnetic anisotropy in a certain direction to a lower portion of the magnetostrictive film 80. More specifically, the lower portion of the magnetostrictive film 80 is surrounded by the heating coil 100, and a high-frequency electric current is passed through the heating coil 100 in order to heat the lower portion of the magnetostrictive film 80 for a given period of time.

In the second cooling step S8, which is carried out during the second torque applying step S6, the steering shaft 22 is cooled down to normal temperature while the torsional torque continues to be applied thereto.

In the second torque releasing step S9, the torsional torque is removed from the steering shaft 22 as well as from the magnetostrictive film 80, thereby rendering the magnetostrictive film 80 magnetically anisotropic. In this manner, the second anisotropic region 92*b* is developed in the lower portion of the magnetostrictive film 80.

In the coil installing step S10, the first coil 82*a* and the second coil 82*b*, each in the form of a multilayer coil for detecting changes in the magnetostrictive characteristics, are placed around the magnetostrictive film 80.

The magnetostrictive torque sensor 50 according to the present embodiment is fabricated by carrying out the above steps S1 through S10.

Major steps among the above steps, i.e., the torque applying steps S2, S6, the high-frequency heating steps S3, S7, the cooling steps S4, S8, and the torque releasing steps S5, S9, will be described in greater detail below.

The steering shaft 22 is made of chromium molybdenum steel (JIS-G-4105, SCM). The magnetostrictive film 80 is in the form of an Ni—Fe alloy film, which is deposited by plating on the outer circumferential surface of the steering shaft 22. Preferably, the Ni—Fe alloy film has a thickness ranging from 5 to 40 μm. If the Ni—Fe alloy film contains about 35 weight % of Fe, then the Ni—Fe alloy film has a tendency to have an increased magnetostriction effect, because the magnetostriction constant thereof becomes large. Therefore, preferably, the Ni—Fe alloy film has such an Fe content.

Then, as shown in FIG. 9A, the steering shaft 22, with the magnetostrictive film 80 deposited thereon, is processed in order to render the magnetostrictive film 80 anisotropic in a certain direction. More specifically, the heating coil 100 is disposed around the upper portion of the magnetostrictive film 80 where the first anisotropic region 92a will be developed, and a torsional torque of 100 Nm, for example, is applied in one direction to the steering shaft 22 (first torque applying step S2). While the torsional torque is applied in one direction to the steering shaft 22, an electric current having a high frequency ranging from 500 kHz to 3 MHz is passed through the heating coil 100 for 1 to 10 seconds, thereby heating the upper portion of the magnetostrictive film 80 (first high-frequency heating step S3).

Figure 10:
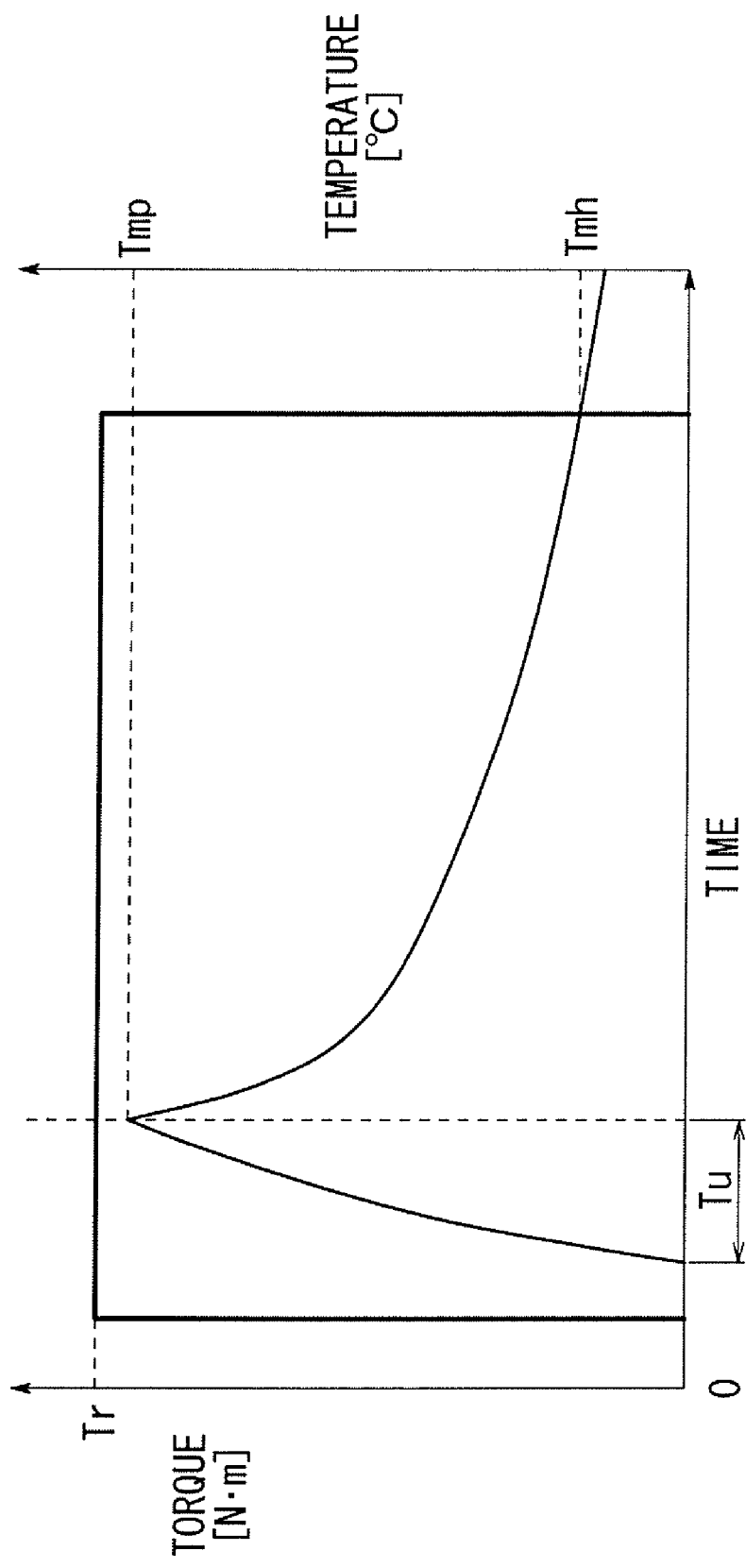
FIG. 10 is a sequence diagram showing the timing at which a torque is applied to the steering shaft, high-frequency heating, cooling of the steering shaft, and removal of the torque.

FIG. 10 is a graph showing how the applied torsional torque and the temperature change over time during the first high-frequency heating step S3. The horizontal axis of the graph represents time, whereas the vertical axis represents the applied torsional torque and the temperature. Before high-frequency electric current starts to be supplied to the heating coil 100, a torsional torque Tr is applied to the steering shaft 22. Then, high-frequency electric current is passed through the heating coil 100 for a period of time Tu (=1 to 10 seconds). When the temperature of the upper portion of the magnetostrictive film 80 reaches Tmp (300° C.), supply of the high-frequency electric current to the heating coil 100 is stopped. Then, the steering shaft 22 is cooled down to room temperature while the torsional torque Tr continues being applied thereto (first cooling step S4). At this time, the steering shaft 22 may be naturally cooled. When the temperature of the upper portion of the magnetostrictive film 80 drops to Tmh (e.g., room temperature), application of the torsional torque Tr to the steering shaft 22 is stopped (first torque releasing step S5), whereupon the first anisotropic region 92a is developed in the magnetostrictive film 80 by carrying out steps S2 through S5.

Thereafter, the steering shaft 22 with the magnetostrictive film 80 deposited thereon is processed in order to render the magnetostrictive film 80 anisotropic in another direction. More specifically, the heating coil 100 is disposed around the lower portion of the magnetostrictive film 80 where the second anisotropic region 92b is to be developed, and a torsional torque of 100 Nm, for example, is applied in the opposite direction, i.e., in a direction opposite to the direction in which the torsional torque was applied during the first torque applying step S2, to the steering shaft 22 (second torque applying step S6). While the torsional torque is applied in the opposite direction to the steering shaft 22, an electric current having a high frequency ranging from 500 kHz to 3 MHz is passed through the heating coil 100 for a period of time Tu (=1 to 10 seconds), thereby heating the lower portion of the magnetostrictive film 80 (second high-frequency heating step S7).

Then, when the temperature of the lower portion of the magnetostrictive film 80 reaches Tmp (300° C.), supply of the high-frequency electric current to the heating coil 100 is stopped. Then, the steering shaft 22 is cooled down to room temperature while the torsional torque Tr is applied thereto (second cooling step S8). When the temperature of the lower portion of the magnetostrictive film 80 drops to Tmh (e.g., room temperature), supply of the torsional torque Tr to the steering shaft 22 is stopped (second torque releasing step S9). As a result of steps S6 through S9, the second anisotropic region 92b is developed in the magnetostrictive film 80.

Since the magnetostrictive film 80 is heated by high-frequency heating, it is possible to separately heat local regions of the magnetostrictive film 80, as shown in FIGS. 9A and 9B. Therefore, a plurality of different magnetic anisotropies can accurately be developed within the single magnetostrictive film 80.

Although a certain preferred embodiment of the present invention has been shown and described in detail, it should be understood that various changes and modifications may be made to the embodiment without departing from the scope of the invention as set forth in the appended claims.

What is claimed is:

1. A magnetostrictive torque sensor comprising:
   a shaft member;
   at least one magnetostrictive film disposed on the shaft member; and
   a plurality of coils for detecting a change in a magnetic property of the magnetostrictive film;
   wherein the at least one magnetostrictive film includes a plurality of regions having different magnetic anisotropies formed therein via localized high-frequency heating after the film has been disposed on the shaft member.

2. A magnetostrictive torque sensor according to claim 1, wherein the coils are disposed in confronting relation to a region of constant thickness of the magnetostrictive film.

3. A magnetostrictive torque sensor according to claim 1, wherein the at least one magnetostrictive film comprises a single magnetostrictive film disposed on the shaft member;
   the single magnetostrictive film includes a first anisotropic region and a second anisotropic region having respective magnetic anisotropies inverse to each other as the different magnetic anisotropies; and
   the coils are disposed in confronting relation to the first anisotropic region and the second anisotropic region, respectively.

4. A magnetostrictive torque sensor according to claim 1, wherein the at least one magnetostrictive film is deposited on the shaft member by Ni—Fe plating.

5. A magnetostrictive torque sensor according to claim 1, wherein the localized high-frequency heating of the magnetostrictive film is conducted while a torsional torque is applied to the shaft member to form the regions having different magnetic anisotropies.

6. A magnetostrictive torque sensor according to claim 1, wherein the at least one magnetostrictive film is a single magnetostrictive film including the plurality of regions having different magnetic anisotropies formed therein.

7. A method of manufacturing a magnetostrictive torque sensor comprising a shaft member, at least one magnetostrictive film mounted on the shaft member, and a plurality of coils for detecting a change in a magnetic property of the magnetostrictive film, wherein the at least one magnetostrictive film includes a plurality of different magnetic anisotropies, the method comprising the steps of:
   forming the at least one magnetostrictive film on a surface of the shaft member; and high-frequency heating the magnetostrictive film while a torsional torque is applied to the shaft member.

8. A method according to claim 7, wherein the step of high-frequency heating the magnetostrictive film comprises the steps of:

placing a heating coil in a position facing a first region of the magnetostrictive film on the shaft member, and high-frequency heating the first region of the magnetostrictive film while the torsional torque is applied in one direction to the shaft member, thereby developing a magnetic anisotropy in the first region of the magnetostrictive film; and placing the heating coil in a position facing a second region of the magnetostrictive film on the shaft member, and high-frequency heating the second region of the magnetostrictive film while the torsional torque is applied in another direction to the shaft member, thereby developing a magnetic anisotropy in the second region of the magnetostrictive film.

9. A method according to claim 7, wherein the step of forming the at least one magnetostrictive film on the shaft member comprises the step of:

forming the at least one magnetostrictive film on a surface of the shaft member by Ni—Fe plating.

* * * * *